United States Patent
Ammo et al.

[19]

[11] Patent Number: 6,034,402
[45] Date of Patent: Mar. 7, 2000

[54] SEMICONDUCTOR DEVICE

[75] Inventors: Hiroaki Ammo, Kanagawa; Takayuki Gomi, Tokyo, both of Japan

[73] Assignee: Sony Corporation, Tokyo, Japan

[21] Appl. No.: 09/095,043

[22] Filed: Jun. 10, 1998

[30] Foreign Application Priority Data

Jun. 10, 1997 [JP] Japan ............................ P09-152485

[51] Int. Cl.[7] ........................................ H01L 29/76
[52] U.S. Cl. ................................... 257/370; 257/378
[58] Field of Search ............................ 257/273, 350, 257/370, 378

[56] References Cited

U.S. PATENT DOCUMENTS 5,744,855 4/1998 Maki et al. ............................. 257/588
5,751,054 5/1998 Yilmaz et al. ......................... 257/603
5,753,957 5/1998 Watabe ................................. 257/378

*Primary Examiner*—Joni Chang
*Attorney, Agent, or Firm*—Hill & Simpson

[57] ABSTRACT

A semiconductor device comprises: a substrate; a first buried layer of a first conduction type formed in the substrate; a second buried layer of the first conduction type formed in the substrate; a third buried layer of the first conduction type formed in the substrate; an epitaxial layer of the first conduction type formed on the substrate; a well region of a second conduction type formed in the epitaxial layer above the third buried layer; source/drain regions of the first conduction type formed in the well region; a first base region of the second conduction type formed in the epitaxial layer above the first buried layer; a first impurity region of the first conduction type formed on the first base region; a second base region of the second conduction type formed in the epitaxial layer above the second buried layer; a second impurity region of the first conduction type formed on the second base region; a first lead-out layer of the first conduction type connected to the first buried layer; and a second lead-out layer of the first conduction type connected to the second buried layer. The second buried layer has an impurity concentration substantially equal to that of the third buried layer.

16 Claims, 22 Drawing Sheets

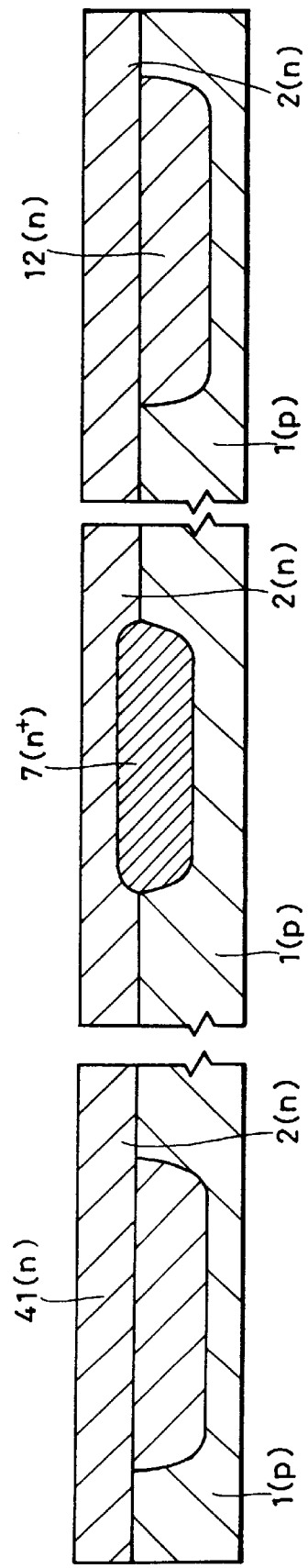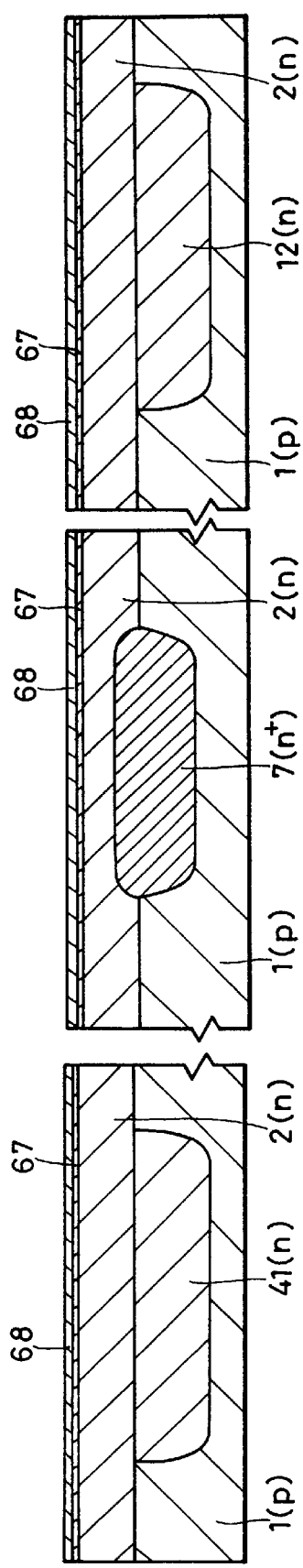

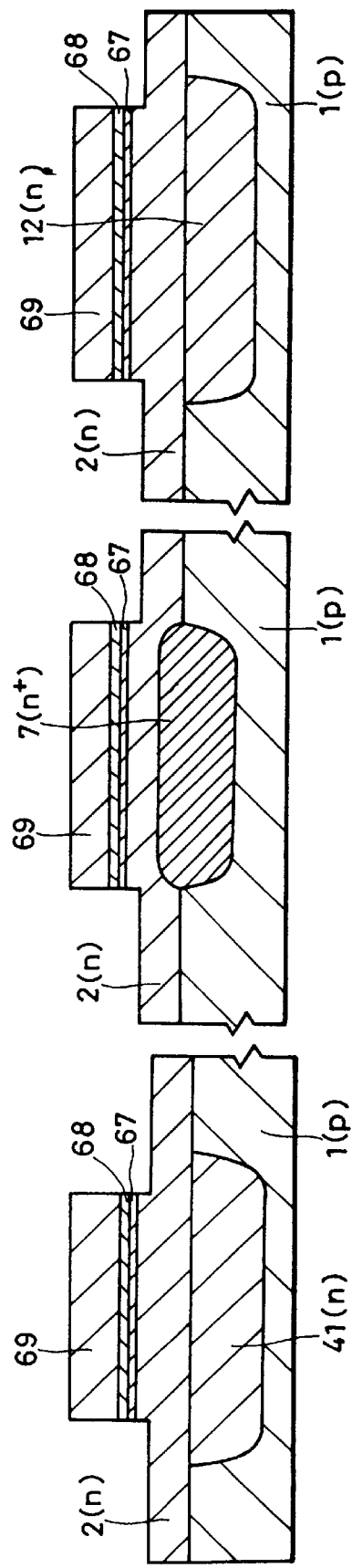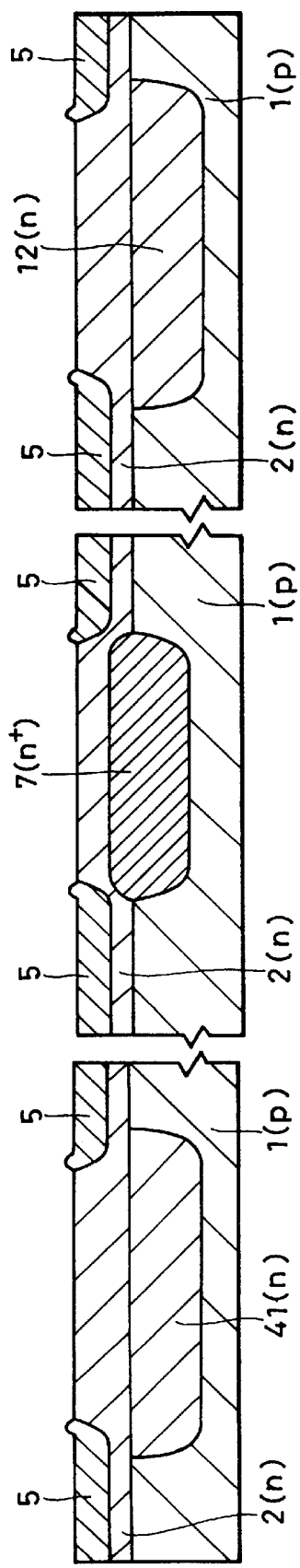

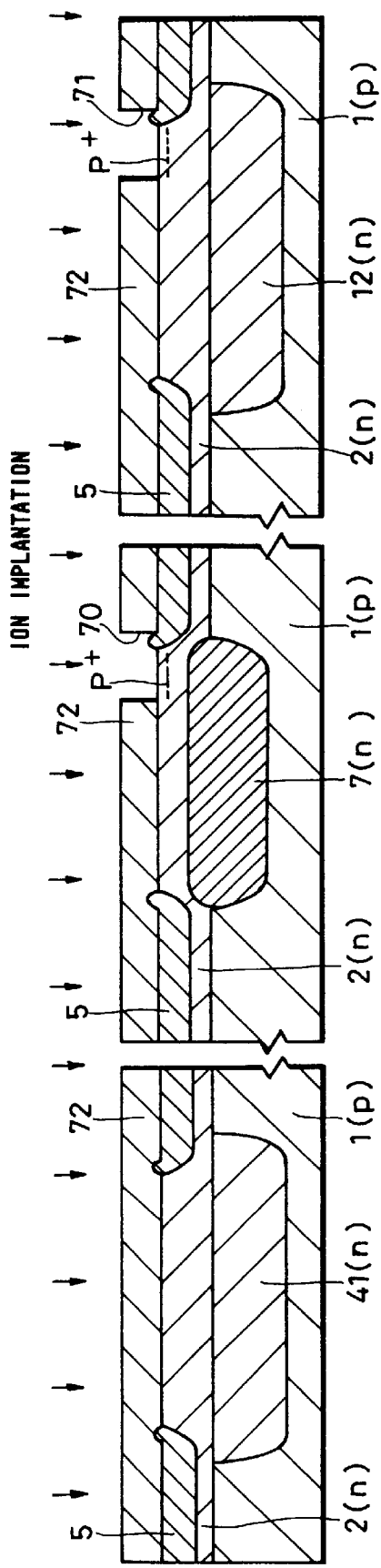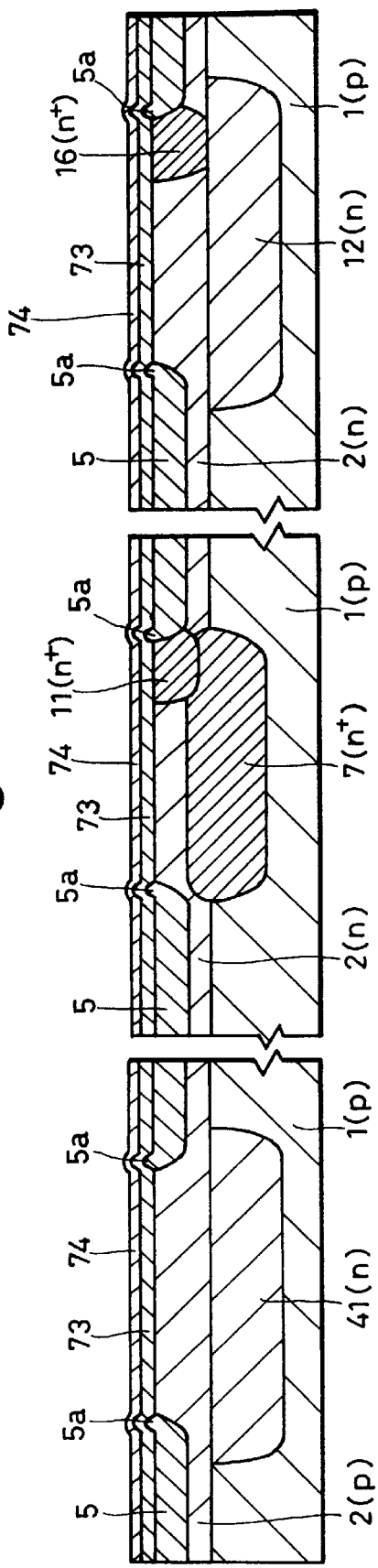

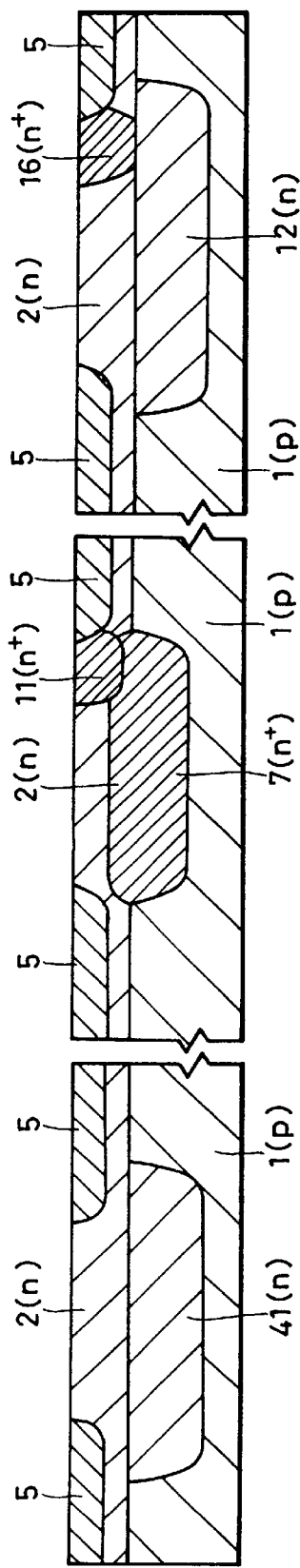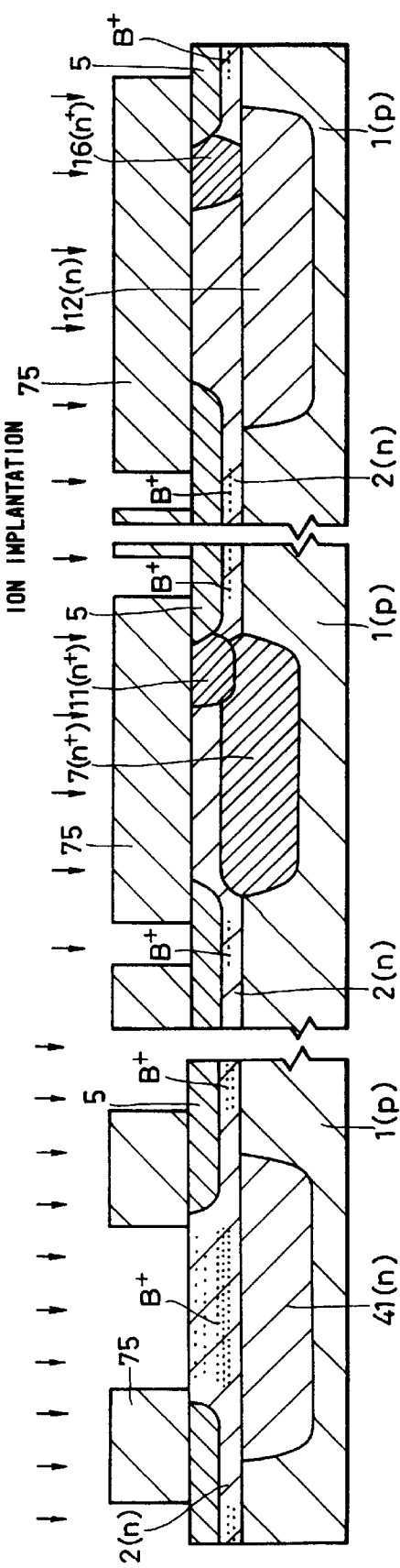

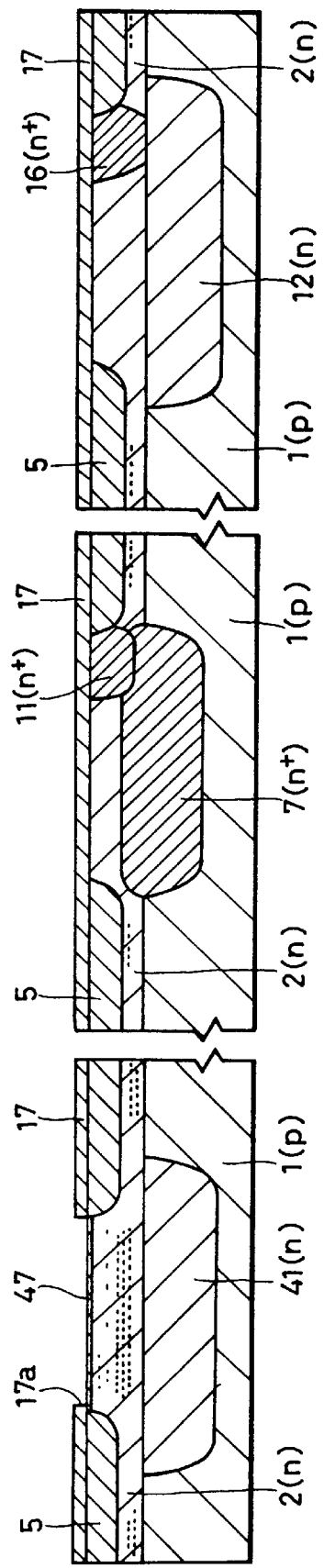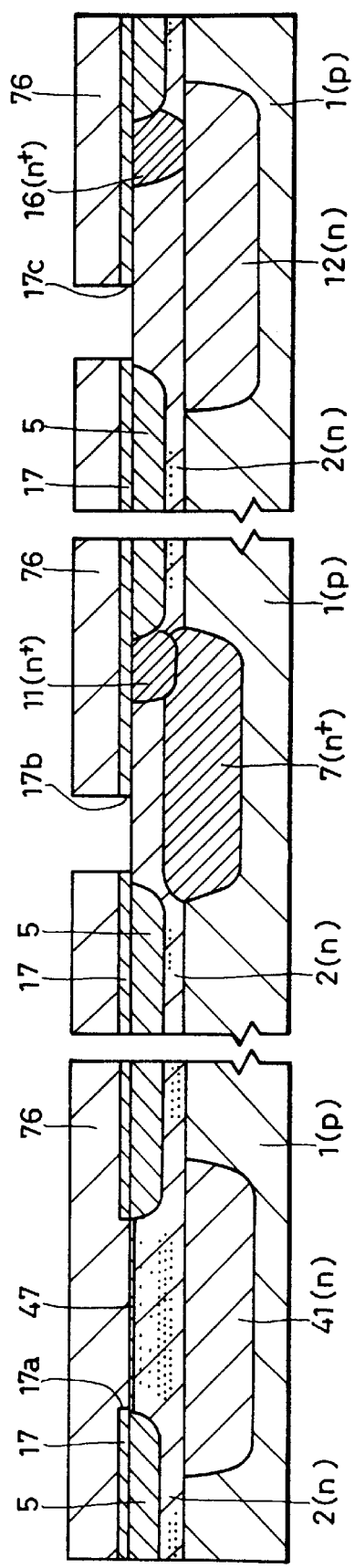
Fig. 17A
Fig. 17B

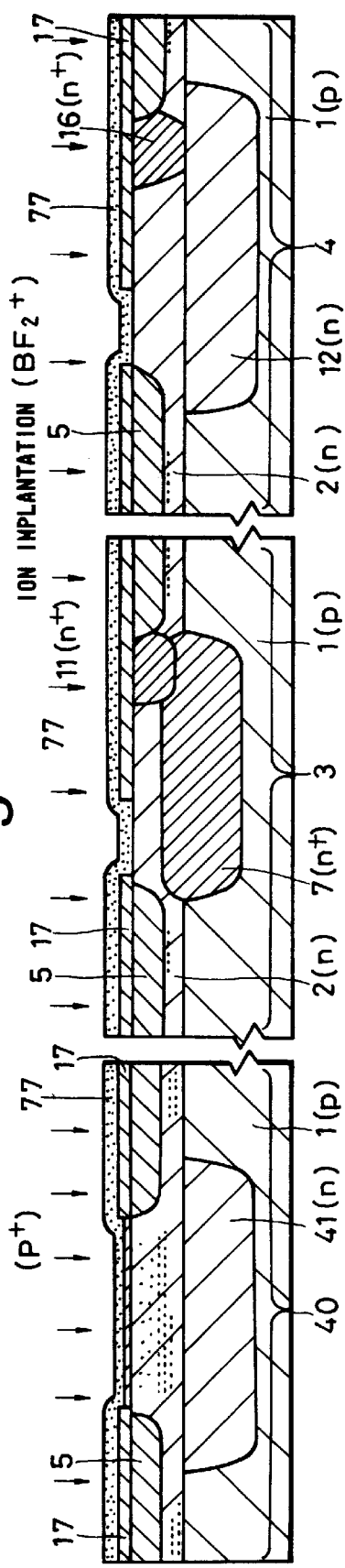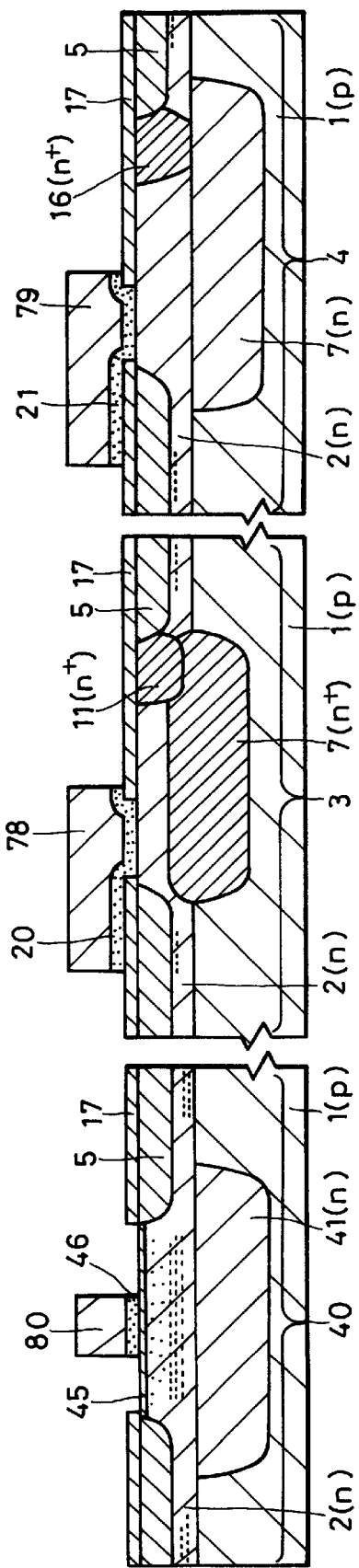

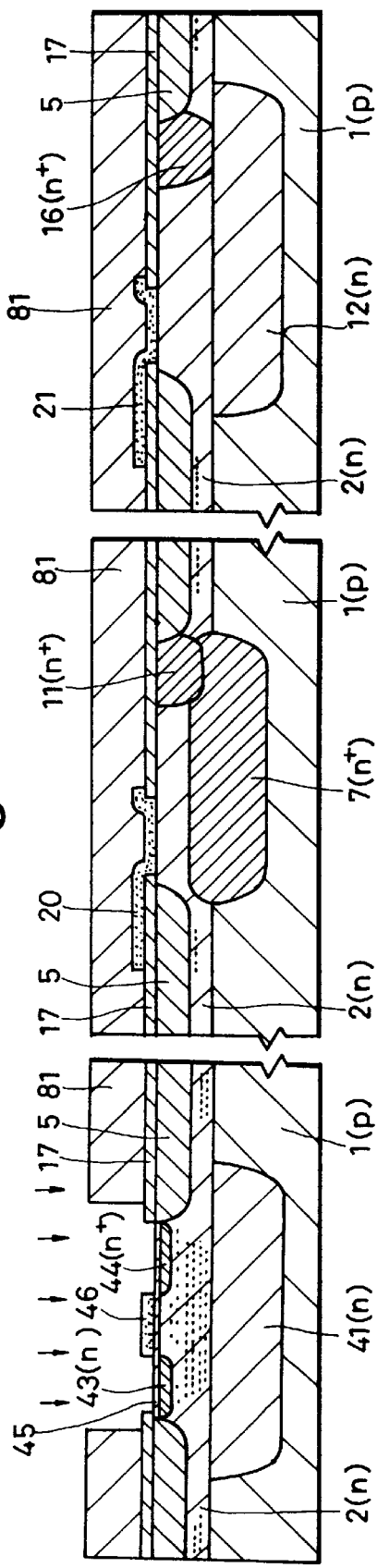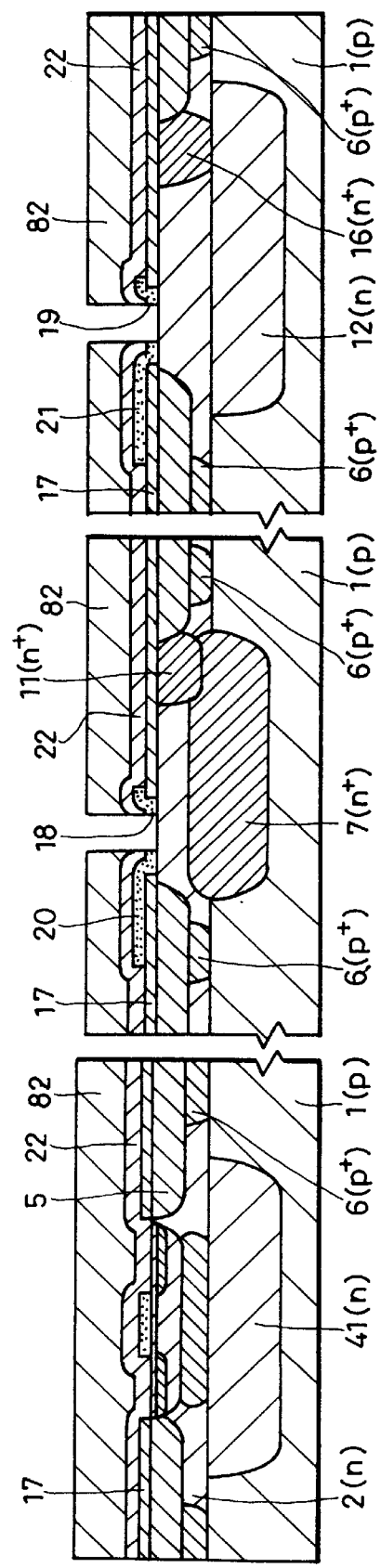

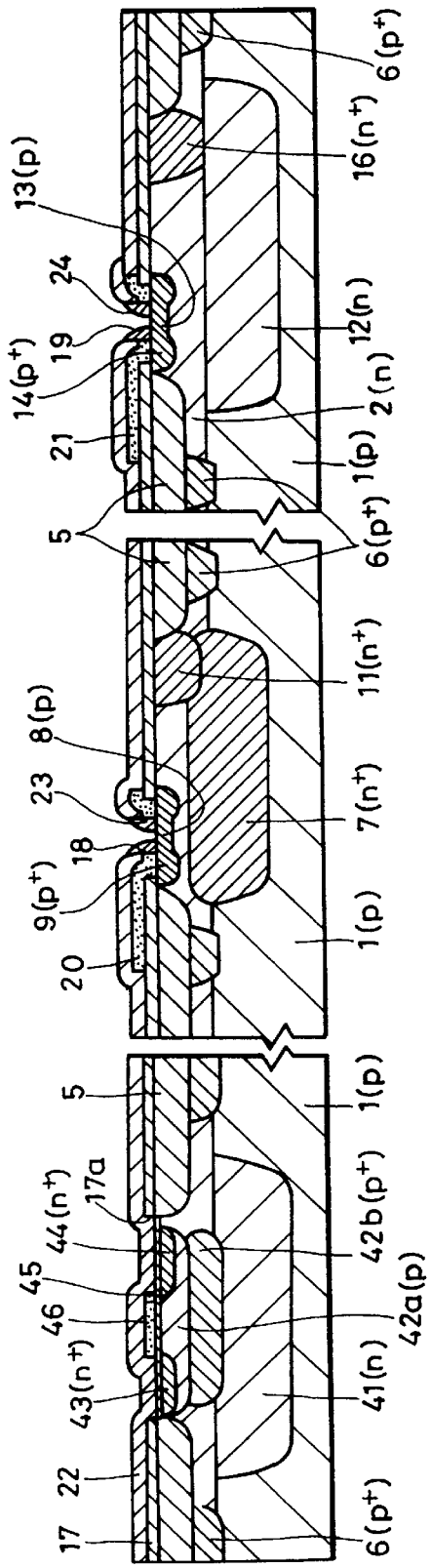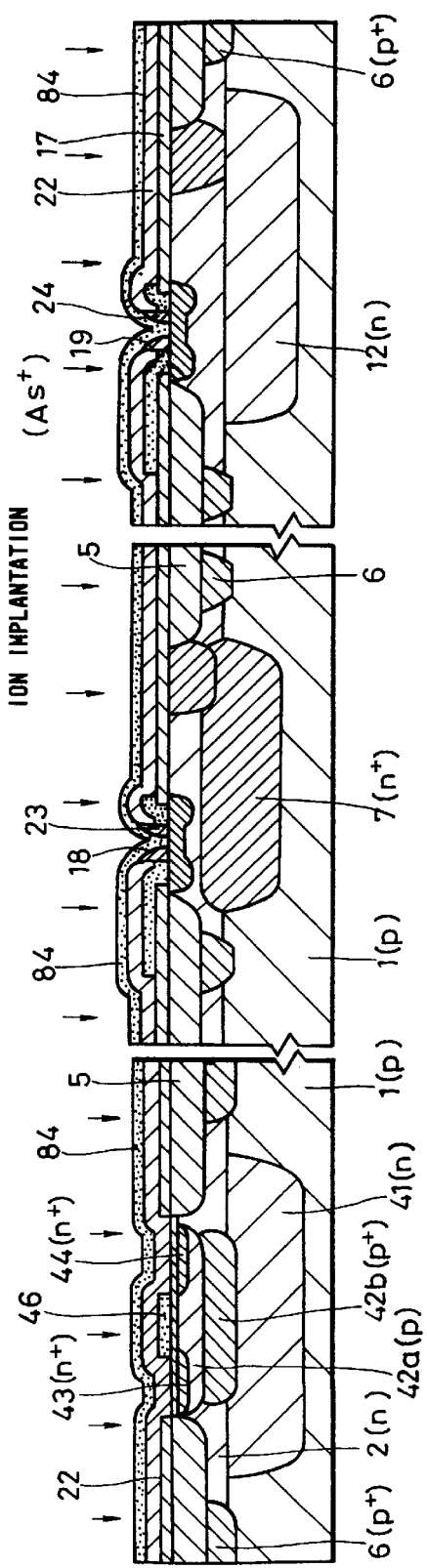

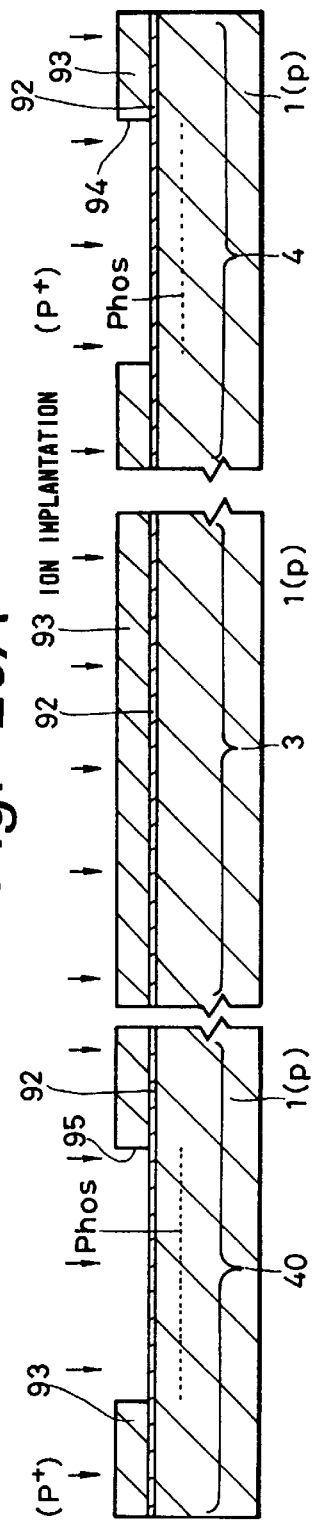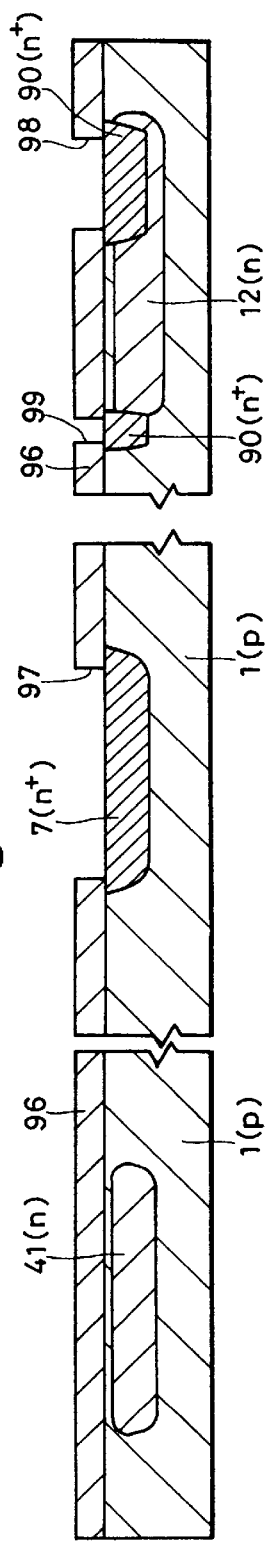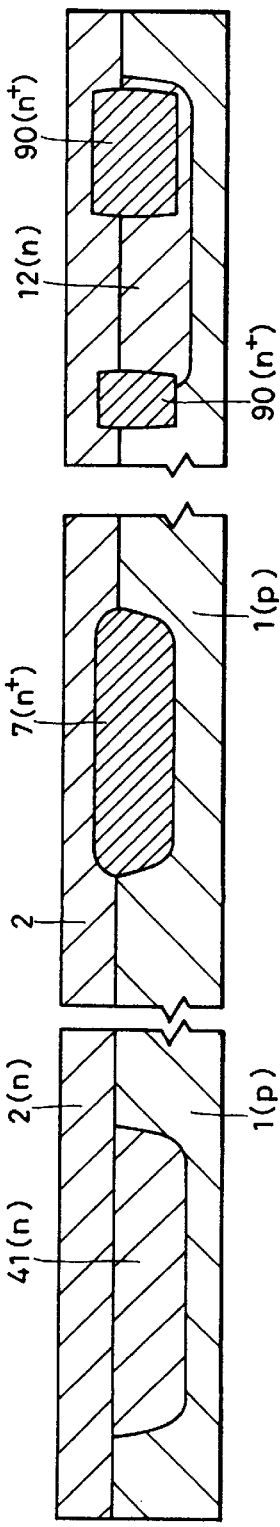

SEMICONDUCTOR DEVICE

BACKGROUND OF THE INVENTION

1. Field of the Invention

This invention relates to a semiconductor device and is particularly suitable for a semiconductor device incorporating both an analog circuit and a digital circuit.

2. Description of the Related Art

FIG. 1 shows a conventional vertical npn bipolar transistor used as a high-speed bipolar transistor. As shown in FIG. 1, in the high-speed bipolar transistor 101 in form of the vertical npn bipolar transistor, an n-type epitaxial layer 103 is grown on a p-type silicon (Si) substrate 102. The Si substrate 102 has formed an n$^+$-type buried diffusion layer 104 in its upper portion so as to bite into a lower portion of the n-type epitaxial layer 103. Formed on the n-type epitaxial layer 103 is a device separating region 105 made of an oxide to isolate the high-speed bipolar transistor 101 from another device. Formed under the device separating region 105 is a p$^+$-type device separating diffusion region 106 extending into the Si substrate 102.

A p-type base layer 107 is formed in an upper portion of the n-type epitaxial layer 103 surrounded by the device separating region 105, and a p$^+$-type graft base layer 108 is formed in opposite ends of the base layer 107 in connection therewith. An n$^+$-type emitter layer 109 lies on the base layer 107, and an n$^+$-type collector lead-out layer 110 is formed in the n-type epitaxial layer 103 in connection with the buried diffusion layer 104 in a location distant from the graft base layer 108.

A first oxide film 111 lies on the n-type epitaxial layer 103 and has formed an aperture 112 above the graft base layer 108. Formed on the first oxide film 111 is a base lead-out electrode 113 connected to the graft base layer 108 through the aperture 112. The base lead-out electrode 113 is covered by a second oxide film 114 formed on the first oxide film 111. The second oxide film 114 has formed an aperture 114a above the emitter layer 109, and its inner wall is covered by a side wall film 116 made of silicon oxide (SiO$_2$). The inner side of the side wall film 116 is used as an emitter aperture 116a through which an emitter lead-out electrode 117 is connected to the emitter layer 109.

Further formed are a base electrode 118 connected to the base lead-out electrode 113 through an aperture 114b formed in the second oxide film 114, an emitter electrode 119 connected to the emitter lead-out electrode 117 through the emitter aperture 116a, and a collector electrode 120 connected to the collector lead-out layer 110 through an aperture 114c formed in the second oxide film 114 and an aperture 111a formed in the first oxide film 111.

Next shown is a conventional vertical npn bipolar transistor used as a high voltage-resistant bipolar transistor. As shown in FIG. 2, in the high voltage-resistant bipolar transistor 121 in form of the vertical npn bipolar transistor, grown on a p-type Si substrate 122 is an n-type epitaxial layer 123 thicker than the n-type epitaxial layer 103 of the high-sped bipolar transistor 101 shown in FIG. 1. The Si substrate 122 has formed an n$^+$-type buried diffusion layer 124 in its upper portion to bite into a lower portion of the n-type epitaxial layer 123. The buried diffusion layer 124 is deeper than the buried diffusion layer 104 in the high-speed bipolar transistor 101. Formed in the n-type epitaxial layer 123 is a device separating region 125 to isolate the high voltage-resistant bipolar transistor 122 from another device. Formed below the device separating region 125 is a p$^+$-type device separating diffusion region 126 extending into the Si substrate 122.

A p-type base layer 127 is formed in an upper portion of the n-type epitaxial layer 123 surrounded by the device separating diffusion region 126, and a p$^+$-type graft base layer 128 is formed in opposite sides of the base layer 127 in connection therewith. An n$^+$-type emitter layer 129 lies on the base layer 127, and an n$^+$-type collector lead-out layer 130 is formed in the n-type epitaxial layer 123 in connection with the buried diffusion layer 124.

A first oxide film 131 lies on the n-type epitaxial layer 123 and has formed an aperture 131a above the graft base layer 128. Formed on the first oxide film 131 is a base lead-out electrode 132 connected to the graft base layer 128 through the aperture 131a. The base lead-out electrode 132 is covered by a second oxide film 133 formed on the first oxide film 131. The second oxide film 133 has formed an aperture 133a above the emitter layer 129, and its inner wall is covered by a side wall film 134 made of SiO$_2$. The inner side of the side wall film 134 is used as an emitter aperture 134a through which an emitter lead-out electrode 135 is connected to the emitter layer 129.

Further formed are a base electrode 136 connected to the base lead-out electrode 132 through an aperture 133b formed in the second oxide film 133, an emitter electrode 137 connected to the emitter lead-out electrode 135 through the emitter aperture 134a, and a collector electrode 138 connected to the collector lead-out layer 130 through an aperture 133c formed in the second oxide film 133 and an aperture 131b formed in the first oxide film 131.

Next explained are distributions of impurity concentration in the depth direction of the high-speed bipolar transistor 101 and the high voltage-resistant bipolar transistor, both taken along the A—A lines, with reference to FIGS. 3 and 4. In these drawings, the ordinate shows impurity concentration in logarithm of arbitrary unit, and the abscissa shows the depth from the surface of the epitaxial layers 103, 123 formed on the Si substrate 102, 122.

As shown in FIG. 3, the distribution of impurity concentration in the depth direction of the high-speed bipolar transistor 121 is characterized in that the n-type epitaxial layer 103 is thin and exhibits a high impurity concentration.

In the impurity concentration of the high voltage-resistant bipolar transistor 121 in FIG. 4, the n$^+$-type emitter layer 129 and the p-type Si substrate 122 have substantially the same impurity concentrations as those of the emitter layer 109 and the Si substrate 102 of the high-speed bipolar transistor 101, but the n-type epitaxial layer 123 has a larger thickness and a lower impurity concentration than those of the n-type epitaxial layer 103 of the high-speed bipolar transistor 101. Additionally, the p-type base layer 127 is generally thicker than the base-layer 107 of the high-speed bipolar transistor 101.

To realize a high voltage-resistance BVcbo in a bipolar transistor, in general, its n-type epitaxial layer must have a low impurity concentration and an ample thickness.

Next shown in FIG. 5 is a conventional bipolar CMOS IC having an n-channel MOS transistor and a vertical npn bipolar transistor. As shown in FIG. 5, in the n-channel MOS transistor 141, an n-type epitaxial layer 143 is grown on a p-type Si substrate 142, and a p$^+$-type diffusion layer 144 is formed in an upper portion of the Si substrate 142 and in the n-type epitaxial layer 143. The n-type epitaxial layer 143 has formed a device separating region 145 made of an oxide to isolate the n-channel MOS transistor 141 from another device. A p-type well region 146 is formed in a portion surrounded by the device separating region 145 which has formed, in its upper portion, an n$^+$-type source region 147 and a drain region 148 in self alignment, and a p⁺-type diffusion region 149. A gate electrode 151 covered by an oxide film 152 is formed on a portion of the p-type well region 146 between the source region 147 and the drain region 148 via a gate oxide film 150. The oxide film 152 covers the entire surface of the n-type epitaxial layer 143. The oxide film 152 has formed apertures in predetermined portions. Through the apertures, the source electrode 153 is formed and connected to the source region 147 and the diffusion region 149, and the drain electrode 154 is formed and connected to the drain region 148.

Next explained is the vertical npn bipolar transistor 155 formed in the n-type epitaxial layer 143 on the Si substrate 142. Construction of the vertical npn bipolar transistor 155 is similar to the high-speed bipolar transistor 101 and the high voltage-resistant bipolar transistor 121 referred to above. That is, formed in an upper portion of the Si substrate 142 is an n⁺-type buried layer 156 diffused into the n-type epitaxial layer 143, and an n⁺-type collector lead-out layer 157 is formed in connection with the buried layer 156. A p⁺-type device separating diffusion region 158 is formed below the device separating region 145 of the n-type epitaxial layer 143. A p-type base layer 159 is formed in an upper portion surrounded by the device separating region 145, and a p-type graft base layer 160 is formed on opposite sides of the base layer 159 in connection therewith. Formed on the base layer 159 is an n⁺-type emitter region 161. Formed on the n-type epitaxial layer 143 is a first oxide film 162 which is made simultaneously with the gate oxide film 150 in the n-channel MOS transistor 141, and a base lead-out electrode 163 connected to the graft base layer 160 is formed on the first oxide film 162. The base lead-out electrode 163 is covered by the oxide film 152, and a side wall film 164 made of SiO₂ is formed in an aperture made in the oxide film 152 above the base layer 160. The inner side of the side wall film 164 is used as an emitter aperture 164a, and an emitter lead-out electrode 165 in form of a polycrystalline Si film is formed and connected to the emitter layer 161 through the emitter aperture 164a.

Further formed are a base electrode 166 connected to the base lead-out electrode 163 through another aperture of the oxide film 152, an emitter electrode 167 connected to the emitter lead-out electrode 165 through another aperture of the oxide film 152, and a collector electrode 168 connected to the collector lead-out layer 157 through another aperture of the oxide film 152 and an aperture formed in the first oxide film 162.

In the bipolar CMOS IC explained above, part of a current i passing through the n-channel MOS transistor flows into the p-type Si substrate 142 through the p-type well region 146, and causes the Si substrate 142 to change in potential. It invites changes in value of the junction capacitance composed of the n⁺-type buried layer 156 of the bipolar transistor 155 and the Si substrate 142, and hence causes various parameters to vary. Especially in an analog/digital mixed bipolar CMOS IC, this phenomenon causes the problem of so-called analog/digital interference noise, in which digital noise enters in an analog signal, and it is a serious problem in a bipolar CMOS IC.

For the purpose of reducing the analog/digital interference noise, it has been proposed to use a npn junction to separate the p-type well region 146 and the Si substrate 142 in the n-channel MOS transistor as shown in FIG. 6. FIG. 7 is a graph showing impurity concentration distribution along the A—A line of FIG. 6.

As shown in FIG. 6, the Si substrate 142 has formed an n-type separation layer 169, and p-type well regions 146 and 170 a of a retrograde structure overlie the n-type separation layer 169. As shown in FIGS. 6 and 7, even when part of the current passing through the n-channel MOS transistor 141 flows into the p-type well regions 146, 170, the n-type separation region 169 prevents it from reaching the Si substrate 142, and therefore reduce the analog/digital interference noise in the bipolar CMOS IC.

However, when the high-speed bipolar transistor 101, high voltage-resistant bipolar transistor 121 and MOS transistor are formed on a common semiconductor substrate, the following problem arises. That is, the n-type epitaxial layer 103 in the high-speed bipolar transistor 101 must have a high impurity concentration and a small thickness to suppress the Kirk effect of the collector whereas the n-type epitaxial layer 123 must has a low impurity concentration and a large thickness to ensure a high resistivity to voltage.

Moreover, if the n-type separation layer is used in the part of the MOS transistor in a bipolar CMOS semiconductor device including the bipolar transistors and the MOS transistor, then a step therefore must be added to the manufacturing process of the bipolar CMOS semiconductor device, and it further increases the manufacturing cost of the bipolar CMOS semiconductor device which is originally expensive, in general.

OBJECTS AND SUMMARY OF THE INVENTION

It is therefore an object of the invention to provide a semiconductor device incorporating a high-speed bipolar transistor, high voltage-resistant bipolar transistor and MOS transistor, which can be made without increasing the manufacturing steps and can reduce the analog/digital interference noise between the bipolar transistors and the MOS transistor.

According to a first aspect of the invention, there is provided a semiconductor device comprising:

a substrate;

a first buried layer of a first conduction type formed in the substrate;

a second buried layer of the first conduction type formed in the substrate;

a third buried layer of the first conduction type formed in the substrate;

an epitaxial layer of the first conduction type formed on the substrate;

a well region of a second conduction type formed in the epitaxial layer above the third buried layer;

source/drain regions of the first conduction type formed in the well region;

a first base region of the second conduction type formed in the epitaxial layer above the first buried layer;

a first impurity region of the first conduction type formed on the first base region;

a second base region of the second conduction type formed in the epitaxial layer above the second buried layer;

a second impurity region of the first conduction type formed on the second base region;

a first lead-out layer of the first conduction type connected to the first buried layer; and a second lead-out layer of the first conduction type connected to the second buried layer, the second buried layer having an impurity concentration substantially equal to that of the third buried layer.

According to a second aspect of the invention, there is provided a semiconductor device comprising:

a substrate;

a first buried layer of a first conduction type formed in the substrate;

a second buried layer of the first conduction type formed in the substrate;

a third buried layer of the first conduction type formed in the substrate;

an epitaxial layer of the first conduction type formed on the substrate;

a well region of a second conduction type formed in the epitaxial layer above the third buried layer;

source/drain regions of the first conduction type formed in the well region;

a first base region of the second conduction type formed in the epitaxial layer above the first buried layer;

a first impurity region of the first conduction type formed on the first base region;

a second base region of the second conduction type formed in the epitaxial layer above the second buried layer;

a second impurity region of the first conduction type formed on the second base region;

a first lead-out layer of the first conduction type connected to the first buried layer; and a second lead-out layer of the first conduction type connected to the second buried layer, the first buried layer having an impurity concentration higher than that of the second buried layer.

The first buried layer is typically deeper than the second buried layer from the substrate.

The well region typically includes a first separating diffusion layer and a second separating diffusion layer, and the first separating diffusion layer has an impurity concentration higher than that of the second separation diffusion layer and is located deeper than the second separating diffusion layer.

The second buried layer is preferably made simultaneously with the third buried layer.

The impurity concentration of the first buried layer is preferably higher than the impurity concentration of the second buried layer.

The second buried layer is preferably as thick as the third buried layer, approximately.

The impurity concentration of the fourth buried layer is substantially the same as the impurity concentration of the first buried layer.

Preferably, the semiconductor device further comprises a fourth buried layer of the first conduction type formed in the second buried layer to connect the second buried layer to the second lead-out layer. The fourth buried layer is substantially the same as the impurity concentration of the first buried layer. The depth of the fourth buried layer is substantially the same as the thickness of the first buried layer.

According to the first aspect of the invention, since the impurity concentration of the second buried layer is substantially the same as the impurity concentration of the third buried layer, the semiconductor device can incorporate a high-speed vertical bipolar transistor, high voltage-resistant vertical bipolar transistor and MIS transistor and can reduce the analog/digital interference noise in the MIS transistor.

According to the second aspect of the invention, since the impurity concentration of the first buried layer is higher than the impurity concentration of the second buried layer, the semiconductor device can incorporate a higher-speed vertical bipolar transistor, high voltage-resistant vertical bipolar transistor and MIS transistor.

The above, and other, objects, features and advantage of the present invention will become readily apparent from the following detailed description thereof which is to be read in connection with the accompanying drawings.

BRIEF DESCRIPTION OF THE DRAWINGS

FIGS. 13A and 13B are cross-sectional views of the semiconductor device according to the first embodiment of the invention in different steps of its manufacturing process;

FIGS. 14A and 14B are cross-sectional views of the semiconductor device according to the first embodiment of the invention in different steps of its manufacturing process;

FIGS. 15A and 15B are cross-sectional views of the semiconductor device according to the first embodiment of the invention in different steps of its manufacturing process;

FIGS. 16A and 16B are cross-sectional views of the semiconductor device according to the first embodiment of the invention in different steps of its manufacturing process;

FIGS. 17A and 17B are cross-sectional views of the semiconductor device according to the first embodiment of the invention in different steps of its manufacturing process;

FIGS. 18A and 18B are cross-sectional views of the semiconductor device according to the first embodiment of the invention in different steps of its manufacturing process;

FIGS. 19A and 19B are cross-sectional views of the semiconductor device according to the first embodiment of the invention in different steps of its manufacturing process;

FIGS. 21A and 21B are cross-sectional views of the semiconductor device according to the first embodiment of the invention in different steps of its manufacturing process;

FIGS. 26A to 26C are cross-sectional views of a semiconductor device according to the second embodiment of the invention.

DETAILED DESCRIPTION OF THE PREFERRED EMBODIMENTS

Figure 1:
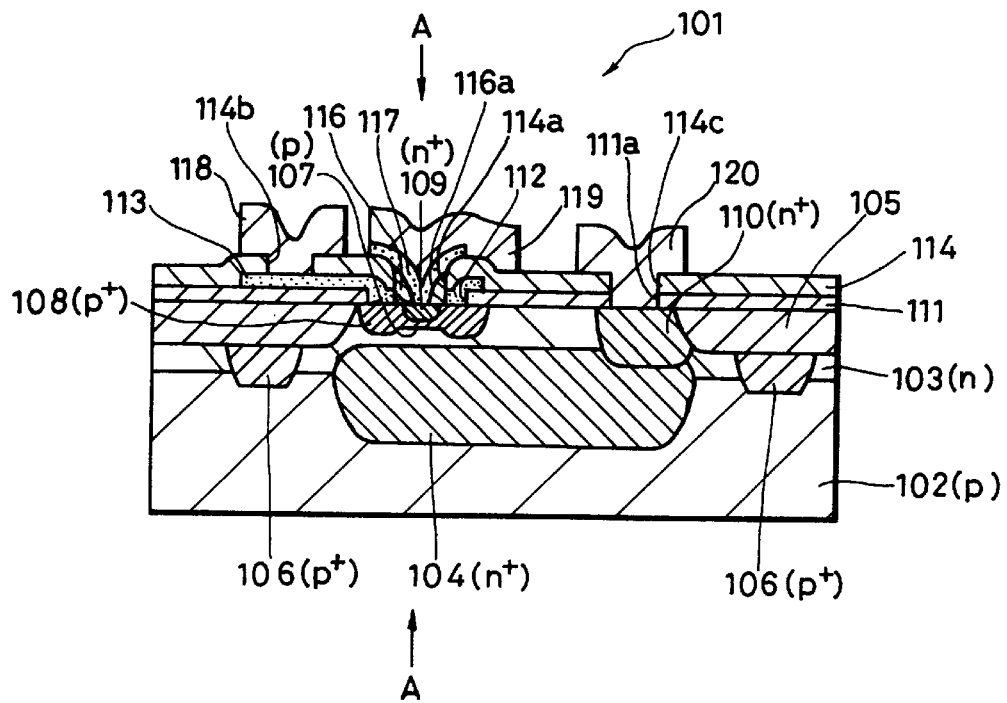
FIG. 1 is a cross-sectional view showing a conventional high-speed bipolar transistor.
Figure 2:
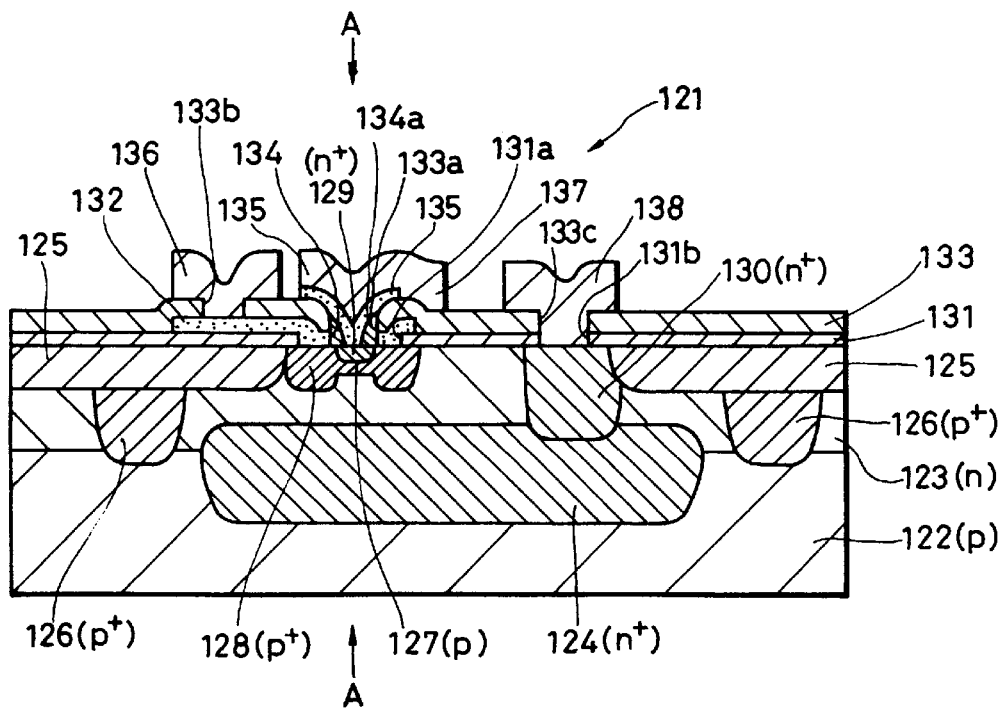
FIG. 2 is a cross-sectional view of a conventional high voltage-resistant bipolar transistor.
Figure 3:
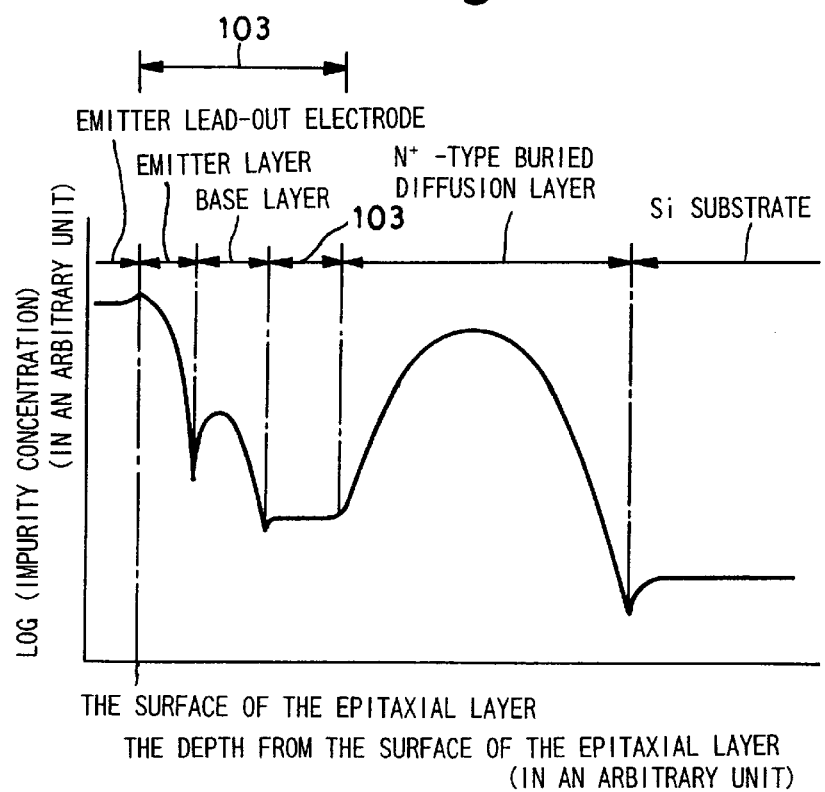
FIG. 3 is a graph showing distribution of impurity concentration in the conventional high-speed bipolar transistor.
Figure 4:
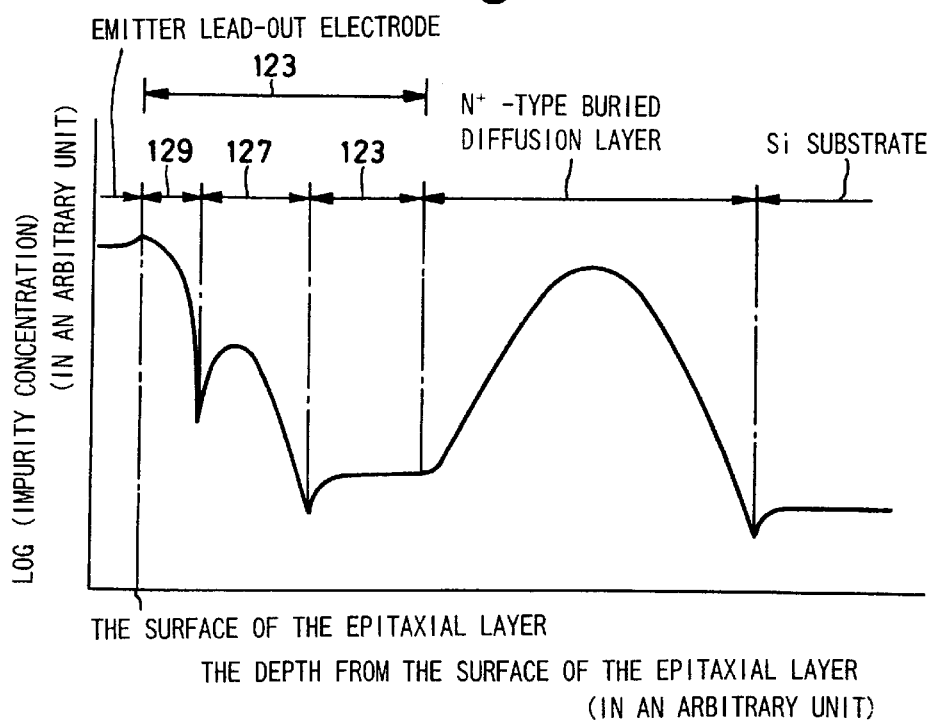
FIG. 4 is a graph showing distribution of impurity concentration in the conventional high voltage-resistant bipolar transistor.

Explained below are embodiments of the invention with reference to the drawings. In all drawings showing the embodiments of the invention, the same or equivalent elements are labeled with common reference numerals.

Figure 8:
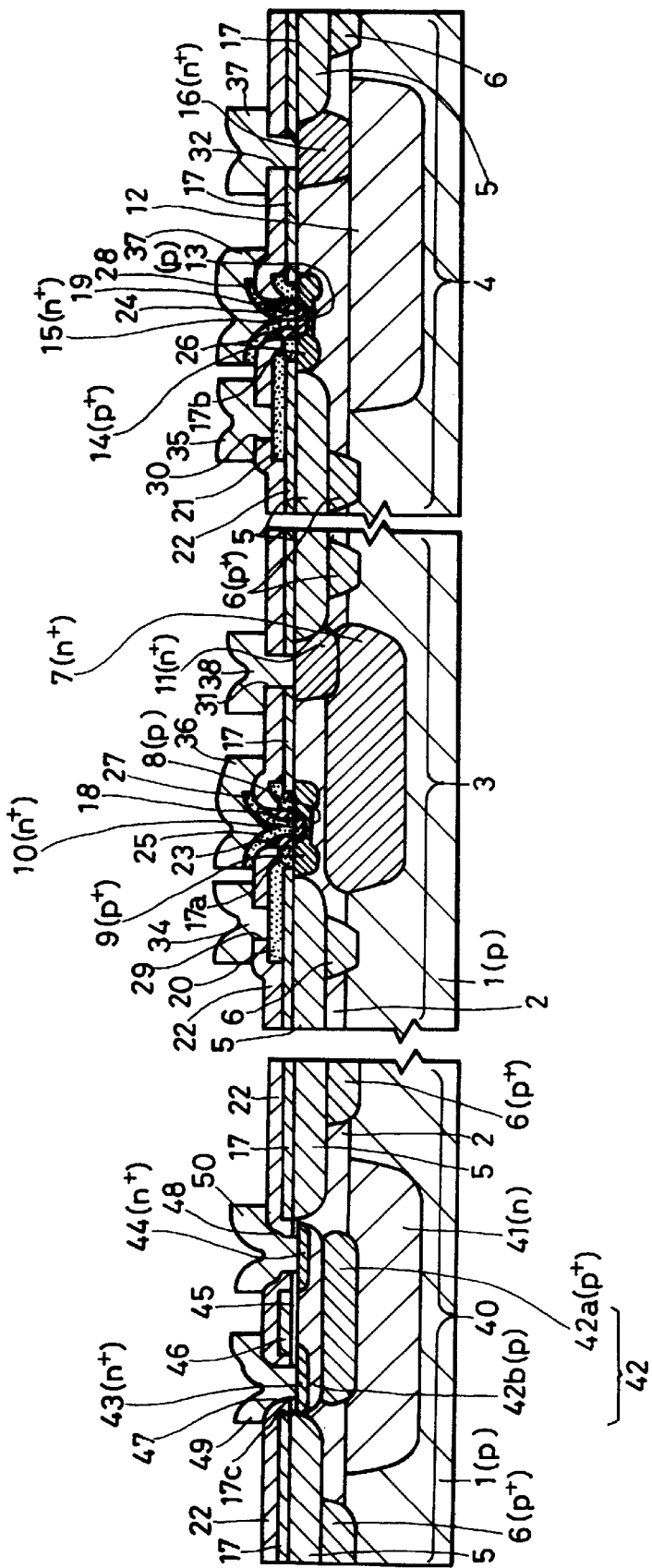
FIG. 8 is a cross-sectional view of a semiconductor device according to the first embodiment of the invention.

First explained is a semiconductor device according to the first embodiment of the invention. FIG. 8 shows a high-speed non bipolar transistor, high voltage-resistant npn bipolar transistor and n-channel MOS transistor.

The semiconductor device according to the first embodiment has a double poly-Si structure. As shown in FIG. 8, an n-type epitaxial layer 2 made of Si, for example, is grown on a p-type Si substrate 1.

The n-type epitaxial layer 2 has formed a device separating region 5 for isolating a first bipolar transistor region 3 as a high-speed bipolar transistor from a second bipolar transistor region 4 as a high voltage-resistant bipolar transistor. Formed under the device separating region 5 is a p$^+$-type device separating diffusion region 6 extending into the Si substrate 1.

An n$^+$-type first buried diffusion layer 7 overlies the Si substrate 1 in the region 3 to bite into a lower portion of the n-type epitaxial layer 2.

Further formed on the n-type epitaxial layer 2 are a p-type base layer 8 and a p$^+$-type graft base layer 9 connected at opposite sides of the base layer 8. An n$^+$-type emitter layer 10 overlies the base layer 8.type collector lead-out layer 11 in connection with the first buried diffusion layer 7 in a location distant from the graft base layer 9.

In the region 4, formed on the Si substrate 1 is a n-type second buried diffusion layer 12 deeper than the first buried diffusion layer 7. The impurity concentration of the second buried diffusion layer 12 is lower than the impurity concentration of the first buried diffusion layer 7 and substantially equal to, or higher than, the impurity concentration of the n-type epitaxial layer 2. The second buried diffusion layer 12 slightly bites into a lower portion of the n-type epitaxial layer 2 (not shown).

In the region 4, formed on the n-type epitaxial layer 2 are a p-type base layer 13 and a p$^+$-type graft base layer 14 in connection with opposite sides of the base layer 13. An n$^+$-type emitter layer 15 overlies the base layer 13. Further formed in the n-type epitaxial layer 2 in the region 4 is an n$^+$-type collector lead-out layer 16 connected to the second buried diffusion layer 12 in a location distant from the graft base layer 14.

A first oxide film 17 is formed on the entire surface of the n-type epitaxial layer 2, and apertures 17a, 17b are formed above the base layers 8, 13 and the graft base layer 9. Formed on the first oxide film 17 are base lead-out electrodes 20, 21 made of polycrystal Si, for example, connected to the graft base layers 9, 14, through the apertures 17a, 17b, respectively, and a second oxide film 22 is formed on the entire surface so as to cover the base lead-out electrodes 20, 21.

The second oxide film 22 has formed apertures 18, 19 above the base layers 8, 13, and side wall films 23, 24 made of SiO$_2$, for example, are formed on inner walls of the apertures 18, 19. Inner sides of the side wall films 23, 24 are used as emitter apertures 25, 26, and emitter layers 10, 15 underlie the emitter apertures 25, 26. Through the emitter apertures 25, 26, emitter lead-out electrodes 27, 28 made of polycrystal Si, for example, are formed and connected to the emitter layers 10, 15.

The second oxide film 22 has formed base contact holes 29 above the base lead-out electrodes 20, 21, and the first oxide film 17 and the second oxide film 22 have formed collector contact holes 31, 32 above the collector lead-out layers 11, 16. Through the base contact holes 29, 30, base electrodes 34, 35 are formed and connected to the base lead-out electrodes 20, 21, and emitter electrodes 36, 37 are formed and connected to the emitter lead-out electrodes 27, 28. Through the collector contact holes 31, 32, collector electrodes 38, 39 are formed and connected to the collector lead-out layers 11, 16.

In an n-channel MOS transistor region 40, the Si substrate 1 has formed an n-type separating diffusion layer 41 having the same depth and the same impurity concentration as those of the second buried diffusion layer 12.

Figure 9:
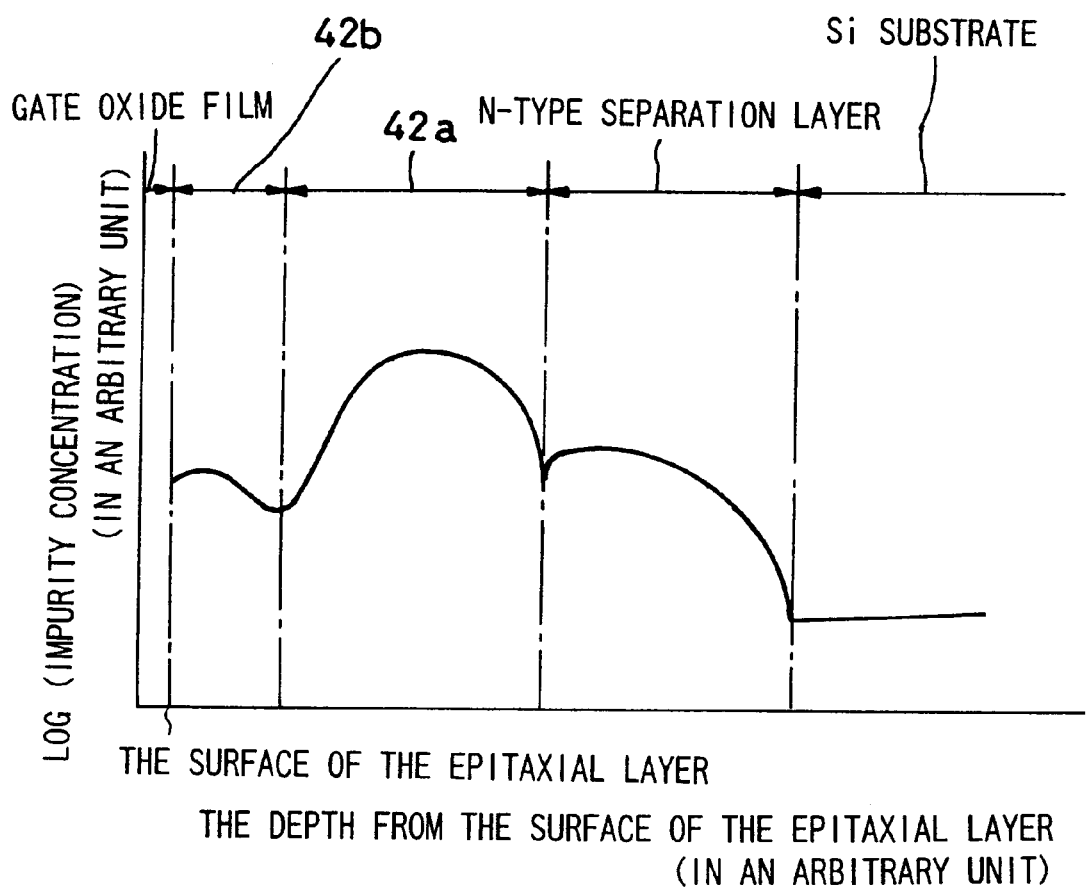
FIG. 9 is a graph showing impurity concentration in the semiconductor device according to the first embodiment of the invention.

The n-type epitaxial layer 2 has formed a p-type well region 42 including a poo-type diffusion layer 42a and a p$^+$-type diffusion layer 42b above the separating diffusion layer 1. That is, the p-type well region 42 has a retrograde structure in which the impurity concentration becomes higher in the depth direction as shown in FIG. 9. The p-type well region 42 further has formed in its upper portion n$^+$-type source/drain regions 43, 44 in self alignment, and a gate electrode 46 is formed on the p$^+$-type well region 42 between the source/drain regions 43, 44 via a gate oxide film 45.

The second oxide film 22 extends to cover the first oxide film 17 and the gate electrode 46 in the region 40, and the second oxide film 22 has formed contact holes 47, 48 above the source/drain regions 43, 44. Electrodes 49, 50 are formed on the second oxide film 22 and connected to the source/drain regions 43, 44 through the contact holes 47, 48.

In this manner, the first bipolar transistor, second bipolar transistor and n-channel MOS transistor are made to form a semiconductor device incorporating both bipolar transistors and a MOS transistor.

Figure 10:
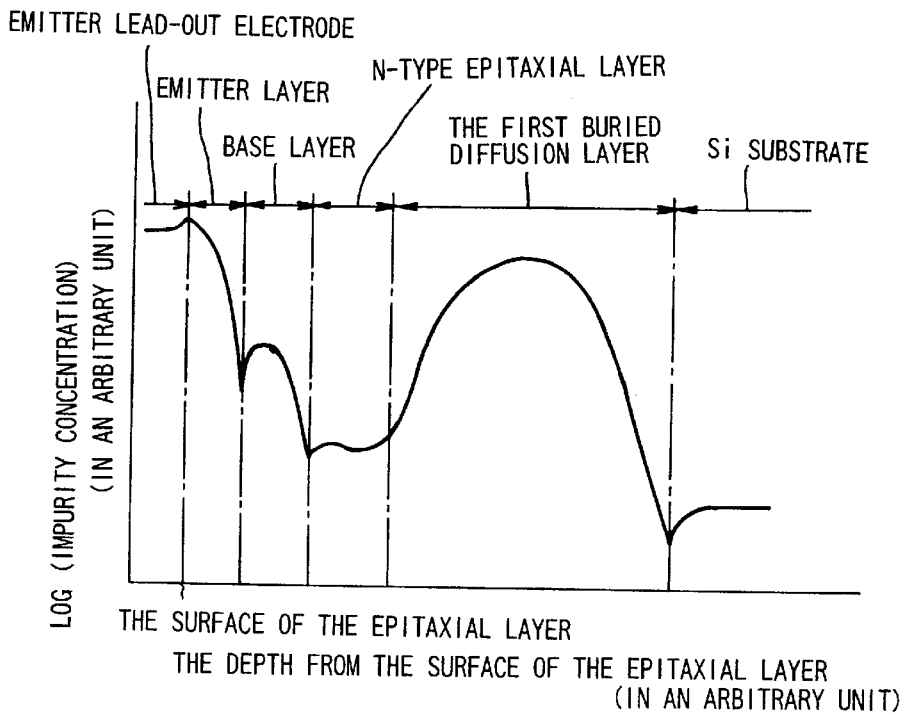
FIG. 10 is a graph showing impurity concentration in the semiconductor device according to the first embodiment of the invention.
Figure 11:
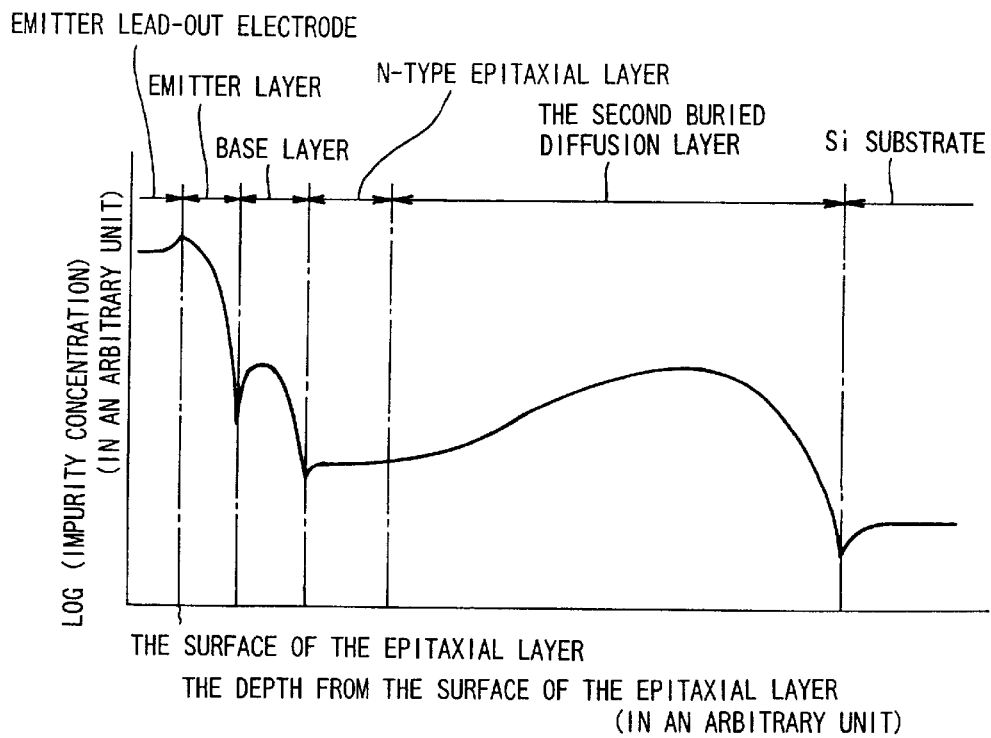
FIG. 11 is a graph showing impurity concentration in the semiconductor device according to the first embodiment of the invention.

Next explained are distribution of impurity concentration in the first bipolar transistor with reference to FIG. 10 and that in the second bipolar transistor with reference to FIG. 11. In the graphs of FIGS. 10 and 11, the ordinate shows impurity concentration (in an arbitrary unit) in common logarithm whereas the abscissa shows the depth (in an arbitrary unit) from the surface of the epitaxial layer.

With reference to FIG. 10, the n-type epitaxial layer 2 in the first bipolar transistor functions as an effective collector layer. That is, the first buried diffusion layer 7 functions to decrease the collector resistance by changing the direction of the collector current apt to flow in the direction along the layer within the n-type epitaxial layer 2 having a low impurity concentration and by making it flow into the first buried diffusion layer 7. Therefore, the n-type epitaxial layer 2 becomes an effective collector layer, and a thin collector layer if formed.

On the other hand, as shown in FIG. 11, the second bipolar transistor having the n-type second buried diffusion layer 12 looks like having a thick n-type epitaxial layer 2. That is, the n-type epitaxial layer 2 and the n-type second buried diffusion layer 12 function as an effective collector layer. Therefore, the effective thickness of the collector layer is larger, and the resistivity of the second bipolar transistor to high voltages is increased.

For these reasons, the effective thickness of the collector layer in the first bipolar transistor is thinner than the effective thickness of the collector layer in the second bipolar transistor, and the impurity concentration of the second buried diffusion layer 12 is lower than the impurity concentration of the first buried diffusion layer 7. Therefor, the first bipolar transistor operates at a higher speed than the second bipolar transistor, and the resistivity of the second bipolar transistor to voltages is higher than the first bipolar transistor. Moreover, since the bipolar transistors can be changed in operation speed and voltage-resistivity by controlling the impurity concentration and the depth of the first buried diffusion layer 7 and the second buried diffusion layer 12, both the first bipolar transistor and the second bipolar transistor can be incorporated on the common Si substrate 1.

As to the n-channel MOS transistor, since the n-type separating diffusion layer 41 is formed in an upper portion of the Si substrate 1, the p-type well region 42 of the n-channel MOS transistor can be isolated from the Si substrate 1 by the pn junction, and the analog/digital interference noise produced between itself and the first or second bipolar transistor can be decreased.

Figure 12A:
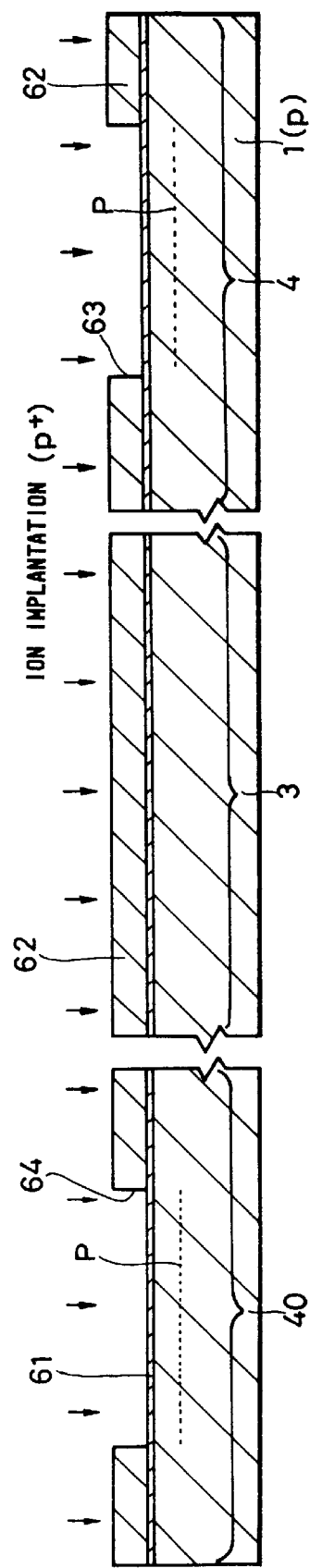
FIGS. 12A and 12B are cross-sectional views of the semiconductor device according to the first embodiment of the invention in different steps of its manufacturing process.

Next explained is a method for manufacturing the semiconductor device according to the first embodiment. As shown in FIG. 12A, an oxide film 61 is formed on the entire surface of the p-type Si substrate 1 having a {100}-oriented major surface, for example. The thickness of the oxide film 61 is preferably chosen in the range of 10 to 30 nm. Next formed is a resist pattern 62 on the oxide film 61 by lithography. The resist pattern 62 covers the region 3 for making the first bipolar transistor to be used as a high-speed vertical npn bipolar transistor, and has formed an aperture 63 above the region 4 for making the second bipolar transistor to be used as a high voltage-resistant vertical npn bipolar transistor and an aperture 64 above the region 40 for making the MOS transistor.

Using the resist pattern 62 as a mask, an n-type impurity, such as phosphorus (P), is ion-implanted into the Si substrate 1 by ion implantation. Appropriate conditions for ion implantation are an ion implanting energy in the range of 300 keV to 1 MeV and a dose amount in the range of $1\times10^{13}$ to $1\times10^{15}$ per $cm^2$. The resist pattern 62 is removed thereafter.

Figure 12B:
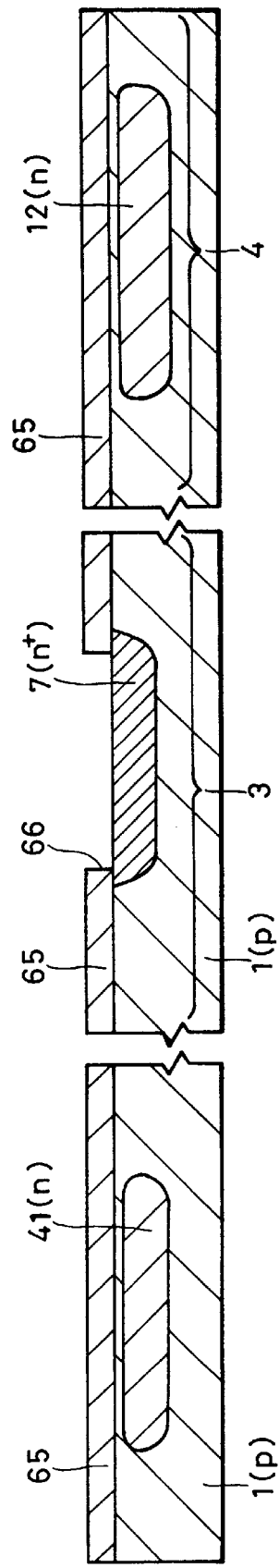

Next, as shown in FIG. 12B, an oxide film 65 is formed on the Si substrate 1 by chemical vapor deposition (CVD), for example. The oxide film 65 may be as thick as 300 nm. In FIG. 12B, the oxide film 61 is contained in the oxide film 65, and not illustrated independently. Then, using a resist pattern (not shown) of a predetermined made by lithography, an aperture 66 is formed in the oxide film 65 by reactive ion etching (RIE), for example. The resist pattern is removed thereafter.

Using the oxide film 65, antimony (Sb) as the n-type impurity is diffused by vapor phase diffusion using antimony trioxide ($Sb_2O_3$), for example, to form the $n^+$-type first buried diffusion layer 7 on the Si substrate 1 in the region 3. For the vapor phase diffusion, the diffusion temperature is set to 1200°, the sheet resistance ps of the first buried diffusion layer 7 to 20 through 50 $\Omega/\circ$, and the diffusion depth xj to 1 through 2 $\mu m$. As a result of the vapor phase diffusion, the n-type impurity having been introduced into the Si substrate 1 in the regions 3 and 40 is diffused to form the n-type second buried diffusion layer 12 and the n-type separating diffusion layer 41, respectively. Simultaneously, a natural oxide film (not shown) is formed on the exposed surface of the Si substrate 1. After that, the oxide films and 61 on the Si substrate 1 are removed sequentially by etching.

As shown in FIG. 13A, the n-type epitaxial layer is next grown on the Si substrate 1 by epitaxial growth. The n-type epitaxial layer 2 is controlled to have a specific resistance in the range of 0.3 to 5 $\Omega\cdot cm$ and a thickness of 0.7 to 2 $\mu m$. By the epitaxial growth, the first buried diffusion layer 7 is extended to a lower portion of the n-type epitaxial layer 2, and the second buried diffusion layer 12 and the separating diffusion layer 41 are extended to a level close to the interface between the n-type epitaxial layer 2 and the Si substrate 1.

Next, as shown in FIG. 13B, an oxide film 67 is formed on the surface of the n-type epitaxial layer 2 by thermal oxidation, for example, and a $Si_3N_4$ film 68 is formed by low pressure CVD, for example. The thickness of the oxide film 67 is 20 to 50 nm, and the thickness of the $Si_3N_4$ film 68 is 50 to 100 nm. Thicknesses of the oxide film 67 and the $Si_3N_4$ film 68 are determined by the length of a bird's beak and the controllability on the stress and defects during local oxidization by LOCOS, for example.

Next as shown in FIG. 14A, a resist pattern 69 of a predetermined configuration is formed on the $Si_3N_4$ film 68 by lithography. Using it as a mask, the oxide film 67, $Si_3N_4$ film 68 and upper part of the n-type epitaxial layer 2 are removed by etching using RIE, for example. That is, the oxide film 67 and the $Si_3N_4$ film 68 are selectively left above the first buried diffusion layer 7, second buried diffusion layer 12 and separating diffusion layer 41. To insure a smooth surface of the device separation region 5 to be made later by LOCOS, the etching depth of the n-type epitaxial layer 2 is approximately a half the thickness of the device separating region 5.

Next as shown in FIG. 14B, the device separating region 5 is formed on the exposed surface of the n-type epitaxial layer 2 by LOCOS, for example. The thickness of the device separating region 5 may be in the range of 0.5 to 1.5 $\mu m$, for example. For LOCOS made here, water vapor may be used as the atmospheric gas, the heating temperature may be set to 1000 through 1050° C., and the oxidization time may be 3 to 8 hours. After that, the $Si_3N_4$ film 68 is removed by wet etching using hot phosphoric acid.

Next as shown in FIG. 15A, a resist pattern 72 having apertures 70, 71 is formed by lithography, and $P^+$ as the n-type impurity is introduced into the n-type epitaxial layer 2 through the apertures 70 and 71 by ion implantation. For the ion implantation made here, the ion implantation energy is set to 40 through 100 kV, and the dose amount is set to $1\times10^{15}$ through $1\times10^{16}$ per $cm^2$. The resist pattern 72 is removed thereafter.

Next, as shown in FIG. 15B, an oxide film 73 is formed on surfaces of the n-type epitaxial layer 2 and the device separating region 5. The thickness of the oxide film 73 is 100 to 600 nm. After that, the product is annealed under a temperature of 900 to 1000° for 30 minutes, for example, to diffuse $P^+$ ions previously introduced as the n-type impurity into the n-type epitaxial layer 2. As a result, $n^+$-type collector diffusion layers 11, 16 are formed. After that, a resist film 74 is formed on the oxide film 73.

The, as shown in FIG. 16A, the resist film 74 and the oxide film 73 are removed sequentially by etching back the entire surface, and an upper part of a bird's head 5a is removed. As a result, surfaces of the n-type epitaxial layer 2 and the device separating region 5 are smoothed.

Next executed is thermal oxidation, fir example, to form an oxide film (not shown) on the surface of the n-type epitaxial layer 2. The thickness of the oxide film may be 10 to 30 nm, for example. The heating temperature used in the thermal oxidation may be 900° C., for example. After that, a resist pattern 75 having an aperture in a predetermined portion is formed by lithography as shown in FIG. 16B.

Using the resist pattern 75 as a mask, $B^+$ as the p-type impurity is ion-implanted into the n-type epitaxial layer 2 by ion implantation. As a result, the $p^+$-type device separating diffusion region 6 and the p-type well region 42b are formed. For ion implantation made here, the ion implantation energy is set to 200 through 900 keV, and the dose amount to $1 \times 10^{13}$ through $1 \times 10^{14}$ per $cm^2$. Still using the resist pattern 75 as a mask, $B^+$ as the p-type impurity is ion-implanted again. As a result, the p-type well region 42a is formed. Note here that, for making the p-type well region 42a, $B^+$ in the device separating diffusion region 6 is introduced into the device separating region 5. For the ion implantation made here, the ion implantation energy is set to 80 through 120 keV, and the dose amount is set to $5 \times 10^{12}$ through $5 \times 10^{12}$ per $cm^2$. As a result of the ion implantation in twice, the p-type well region 42 having a retrograde structure excellent in latch-up resistivity is formed. The resist pattern 75 is removed thereafter.

Next as shown in FIG. 17A, the first oxide film 17 is formed on the n-type epitaxial layer 2 and the device separating region 5 by CVD, for example. the thickness of the first oxide film 17 may be 50 to 200 nm, for example. Then, using a resist pattern (not shown) formed on the entire surface as a mask, the first oxide film 17 is selectively removed by RIE, for example. As a result, the aperture 17a is made in the first oxide film 17 above the n-type epitaxial layer 2. For RIE made here, a mixed gas containing $O_2$ gas and $CHF_3$ gas, for example, is used as the etching gas. The resist pattern is removed thereafter. Then, the surface of the n-type epitaxial layer 2 at the bottom of the aperture 17a is oxidized by thermal oxidation to form a gate oxide film 45. The thickness of the gate oxide film 47 may be 10 to 30 nm, for example.

Next as shown in FIG. 17B, a resist pattern 76 having apertures in predetermined positions is formed by lithography. Using the resist pattern 76 as a mask, the first oxide film 17 and another oxide film (not shown) on the n-type epitaxial layer 2 are selectively removed sequentially by RIE, for example. The etching gas used for RIE made here may be a mixed gas containing $O_2$ gas and $CHF_3$ gas, for example. As a result, apertures 17b and 17c are made. The resist pattern 76 is removed thereafter.

Next referring to FIG. 18A, a polycrystalline Si film 77 is formed on the entire surface by CVD, for example, so as to cover the first oxide film 17 and the gate oxide film 45. The thickness of the polycrystalline Si film 77 may be, for example, 100 to 300 nm. Next formed is a resist pattern (not shown) on the polycrystalline Si film 77 by lithography. Using it as a mask, $BF_2^+$ as the p-type impurity is selectively ion-implanted into the polycrystalline Si film 77 in the regions 3 and 4. For the ion implantation, the ion implantation energy is set to 30 through 70 keV, and the dose amount to $1 \times 10^{14}$ through $1 \times 10^{14}$ per $cm^2$. The resist pattern (not shown) is removed thereafter. Then, another resist pattern (not shown) is formed on the polycrystalline Si film 77 by lithography. Using the resist pattern (not shown) as a mask, $P^+$ as the n-type impurity is ion-implanted selectively d into the polycrystalline Si film 77 in the n-channel MOS transistor. For the ion implantation, the ion implantation energy is set to 30 through 70 keV, and the dose amount to $1 \times 10^{14}$ through $2 \times 10^{16}$ per $cm^2$.

After that, as shown in FIG. 18B, resist patterns 78, 79 and 80 having appropriate configurations are formed in the regions 3, 4 and 40, respectively, by lithography. Using these resist patterns 78, 79 and 80, the polycrystalline Si film 77 is selectively removed by RIE, for example, to form the base lead-out electrodes 20, 21 and the gate electrode 47. The etching gas used for RIE made here may be a mixed gas containing trichloro-trifluoromethane ($C_2Cl_3F_3$) gas and sulphur hexafluoride ($SF_6$) gas.

Next as shown in FIG. 19A, a resist pattern 81 having an aperture in a predetermined position is formed by lithography. Using the resist pattern 81 and the gate electrode 46 as a mask, arsenic (As) as the n-type impurity is ion-implanted into the n-type epitaxial layer 2. As a result, the source/drain regions 43, 44 of the n-channel MOS transistor are formed in self alignment. For the ion implantation made here, the ion implanting energy is set to 20 through 70 keV, and the dose amount to $1 \times 10^{14}$ through $1 \times 10^{16}$ per $cm^2$. The resist pattern 81 is removed thereafter.

Next as shown in FIG. 19B, the second oxide film 22 is formed on the entire surface so as to cover the base lead-out electrodes 20, 21 and the gate electrode 4 by CVD, for example. Then, a resist pattern 82 having apertures in predetermined portions is formed on the second oxide film 22 by lithography.

Using the resist pattern 82 as a mask, the oxide film 22 and the base lead-out electrodes 20, 21 are selectively removed by etching by RIE, for example, to make apertures 18, 19. The etching gas used for etching the second oxide film 22 may be a mixed gas containing $O_2$ gas and $CHF_3$ gas, for example, and the etching gas for etching the base lead-out electrodes 20, 21 may be a mixed gas containing $C_2Cl_3F_3$ gas and $SF_6$ gas. The resist pattern 82 is removed thereafter.

Figure 20A:
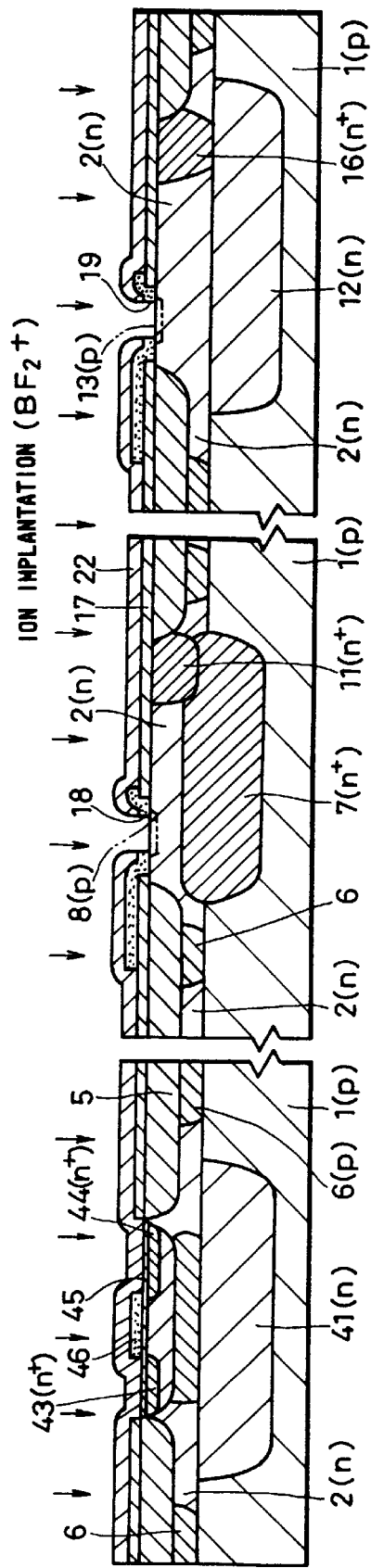
FIGS. 20A and 20B are cross-sectional views of the semiconductor device according to the first embodiment of the invention in different steps of its manufacturing process.

Next as shown in FIG. 20A, an oxide film (not shown) as thick as 10 nm, for example, is formed on the entire surface by thermal oxidation, for example, for use as a buffer layer during ion implantation. Using the second oxide film 22 as a mask, $BF_2^+$ as a p-type impurity is ion-implanted into the n-type epitaxial layer 2. As a result, the base layers 8, 13 are formed in the n-type epitaxial layer 2. For the ion implantation made here, the ion implanting energy is set to 20 through 100 keV, and the dose amount to $1 \times 10^{13}$ through $1 \times 10^{14}$ per $cm^2$.

Figure 20B:
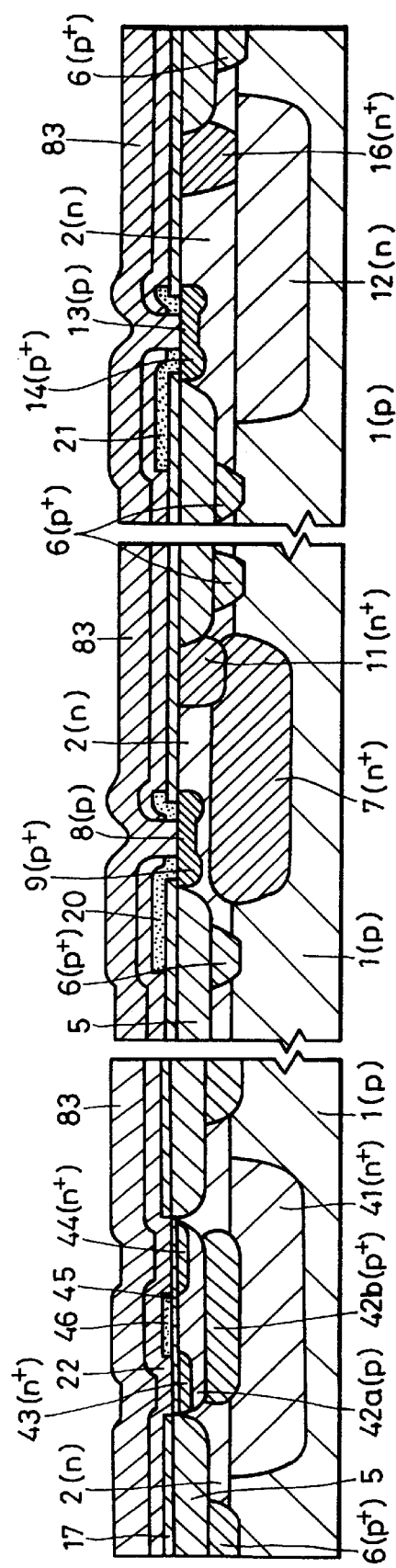

Next as shown in FIG. 20B, an oxide film 83 is formed to cover the entire surface by CVD, for example. The thickness of the oxide film 83 may be, for example, 300 to 600 nm. After that, the product is annealed to activate the base layers 8, 13, device separating diffusion region 6, and source/drain regions 43, 44. For the annealing made here, the heating temperature is set in the range of 800 to 950° C., and the heating time is set to 10 through 60 minutes. During the annealing, p-type impurity, B, of a high impurity concentration is diffused from the base lead-out electrodes 20, 21 into the n-type epitaxial layer 2 to form the $p^+$-type graft base layers 9, 14.

Next formed on the oxide film 83 is a resist pattern (not shown) having a predetermined configuration. Using it as a mask, the oxide film 83 is selectively removed by anisotropic etching so that the side wall films 23, 24 are left on the inner walls of the apertures 18, 19.

Next as shown in FIG. 21B, a polycrystalline Si film 84 is formed on the entire surface by CVD, for example, and $As^+$ as an n-type impurity is ion-implanted into the entire area of the polycrystalline Si film 84. The thickness of the polycrystalline Si film 84 may be, for example, 50 to 200 nm. For ion implantation made here, the ion implanting energy is set to 30 through 100 keV, and the dose amount to $1 \times 10^{15}$ through $1 \times 10^{16}$ per $cm^2$.

Figure 22A:
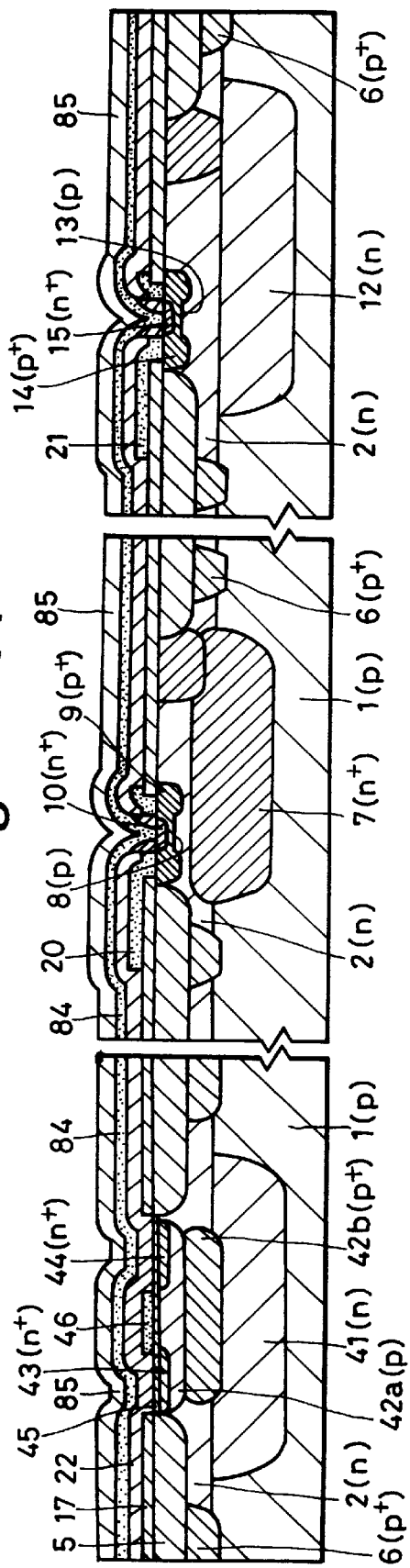
FIGS. 22A and 22B are cross-sectional views of the semiconductor device according to the first embodiment of the invention in different steps of its manufacturing process.

Next as shown in FIG. 22A, an oxide film 85 is formed on the polycrystalline Si film 84 by CVD, for example. The thickness of the oxide film 85 is, for example, 300 nm. After that, the impurity in the polycrystalline Si film 84 is diffused to upper portions of the base layers 8, 13 by furnace annealing to activate the n$^+$-type emitter layers 10, 15 and to simultaneously activate the graft base layers 9, 14. For the furnace annealing made here, the annealing temperature is set to 800° C. through 950° C., and the annealing time is set to 10 through 60 minutes.

Figure 22B:
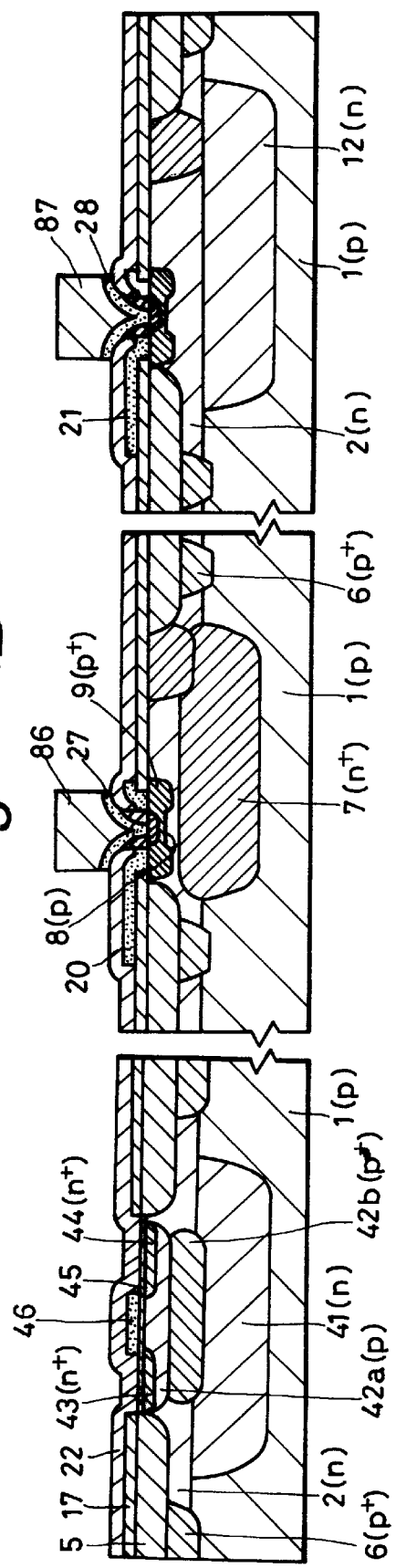

Next as shown in FIG. 22B, the oxide film 85 is removed by wet etching, and resist patterns 86, 87 are formed by lithography so as to cover the emitter portions. Using the resist patterns 86, 87 as a mask, the polycrystalline Si film 84 is selectively removed by etching to form the emitter lead-out electrodes 27, 28. the etching gas used here is a mixed gas containing $C_2Cl_3F_3$ gas and $SF_6$ gas. The resist patterns 86, 87 are removed thereafter.

Figure 23:
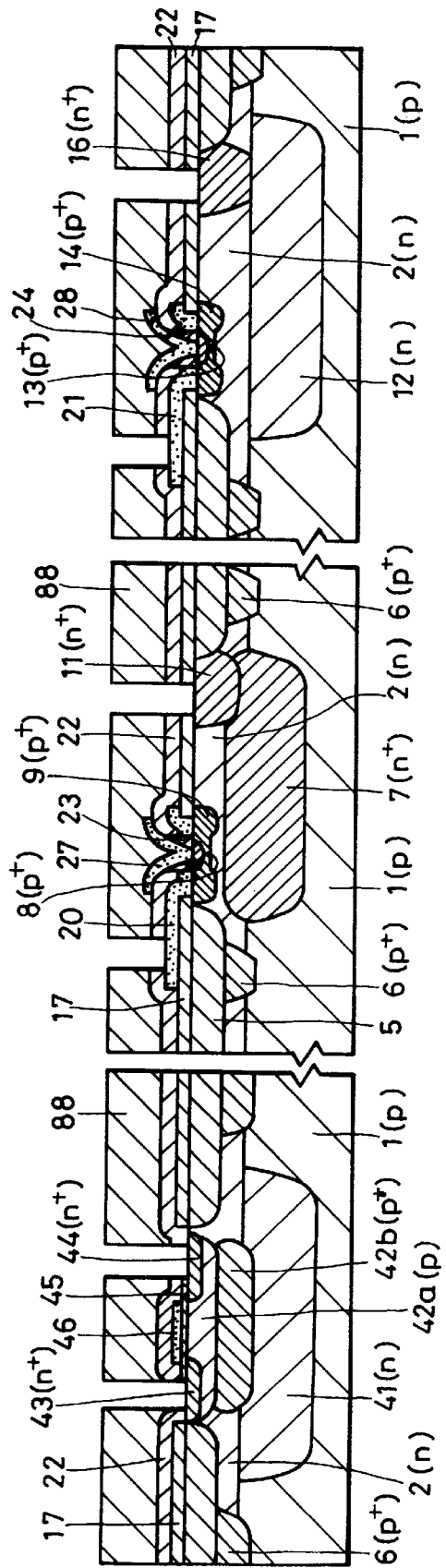
FIG. 23 is a cross-sectional view of the semiconductor device according to the first embodiment of the invention in a step of its manufacturing process.

Next as shown in FIG. 23, a resist pattern 88 having apertures in predetermined portions is formed by lithography. Using the resist pattern 88 as a mask, the second oxide film 22 and the first oxide film 17 are selectively removed sequentially by RIE, for example, to expose surfaces of the base lead-out electrodes 20, 21, collector lead-out diffusion layers 11, 16 and source/drain regions 43, 44.

Figure 24:
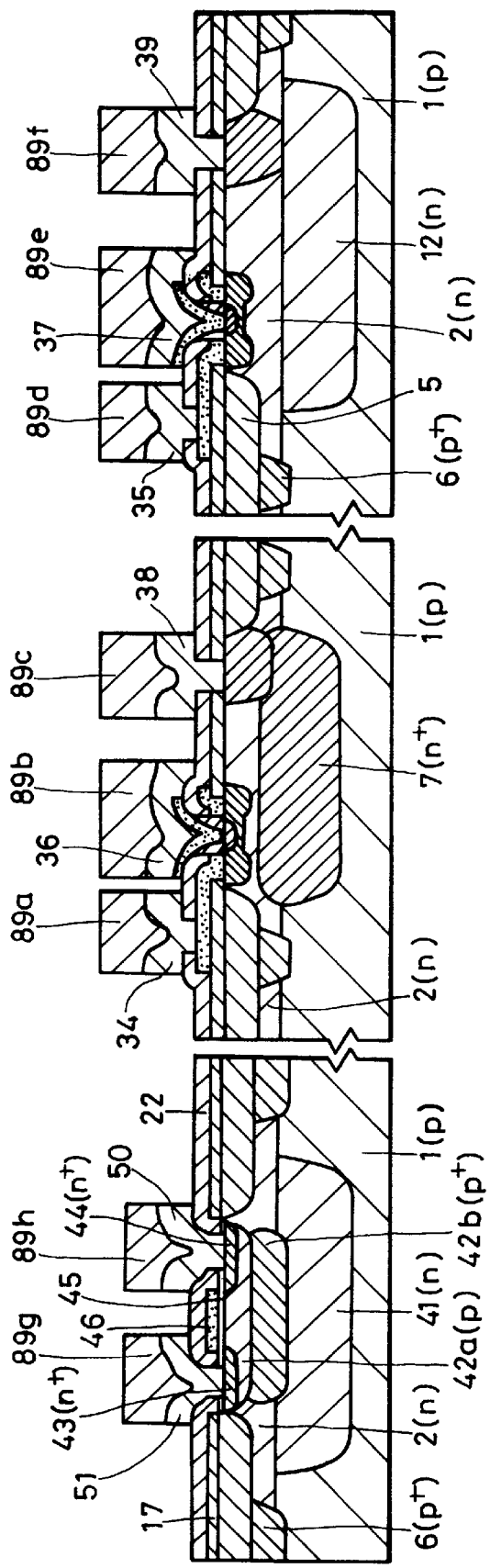
FIG. 24 is a cross-sectional view of the semiconductor device according to the first embodiment of the invention in a step of its manufacturing process.
Figure 25:
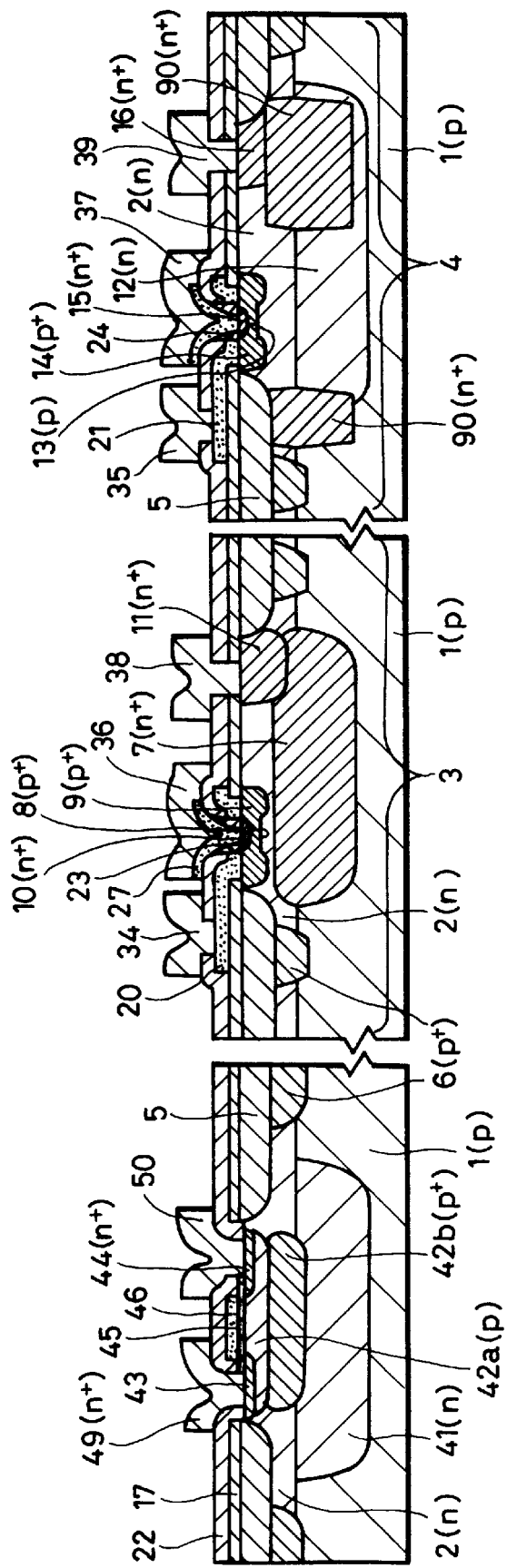
FIG. 25 is a cross-sectional view of a semiconductor device according to the second embodiment of the invention.

Next as shown in FIG. 24, after a barrier metal layer (not shown) and an aluminum (Al) compound wiring layer are formed by sputtering, for example, resist patterns 89a through 89h are formed by lithography. Using these resist patterns 89a through 89h as a mask, the barrier metal layer and the Al alloy wiring layer are patterned to form the base electrodes 34, 35, emitter electrodes 36, 37, collector electrodes 38, 39 and electrodes 49, 50. The resist patterns 89a through 89h are removed thereafter.

After the process explained above, the first bipolar transistor as a high-speed vertical npn bipolar transistor, the second bipolar transistor as a high voltage-resistant vertical npn bipolar transistor, and n-channel MOS transistor as shown in FIG. 8 are formed on the common Si substrate 1. After that, by making a multi-layered wiring by a known method, the semiconductor device is completed.

According to the first embodiment, since the n-type separating diffusion layer 41 in the n-channel MOS transistor and the second buried diffusion layer 12 used in the second bipolar transistor for increasing its resistivity to voltage are formed simultaneously, the second buried diffusion layer 12 is prevented from extending to the n-type epitaxial layer 2. Therefore, a high voltage-resistant vertical npn bipolar transistor can be made without increasing the thickness of the n-type epitaxial layer 2. Additionally, since the separating diffusion layer 41 necessary for reducing the analog/digital interference noise in the n-channel MOS transistor can be made without inviting a significant increase of steps in the manufacturing process, the higher-speed vertical npn bipolar transistor, higher voltage-resistant vertical npn bipolar transistor and MOS transistor resistant to analog/digital interference noise can be made on the common Si substrate 1.

Figure 5:
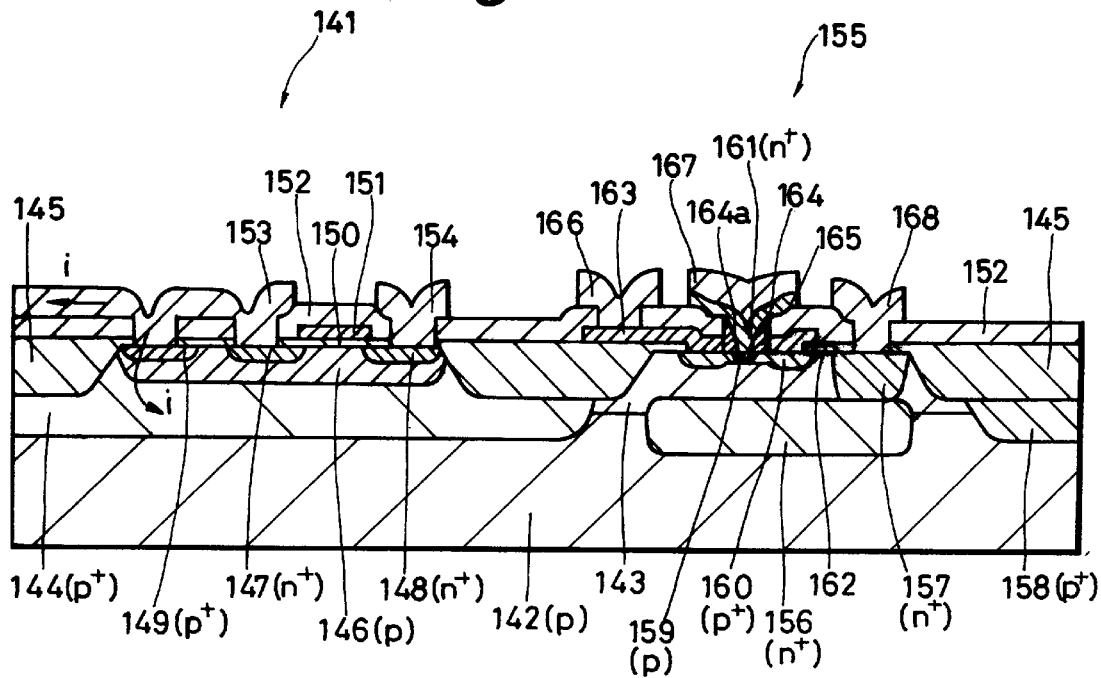
FIG. 5 is a cross-sectional view of a conventional bipolar CMOS transistor.
Figure 6:
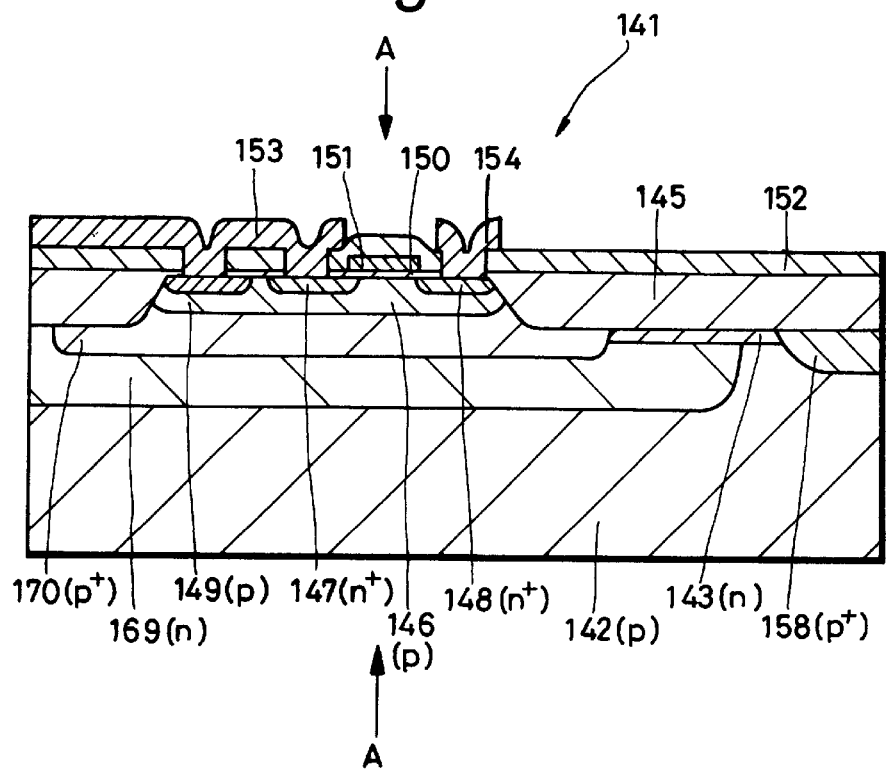
FIG. 6 is a cross-sectional view of a conventional MOS transistor.
Figure 7:
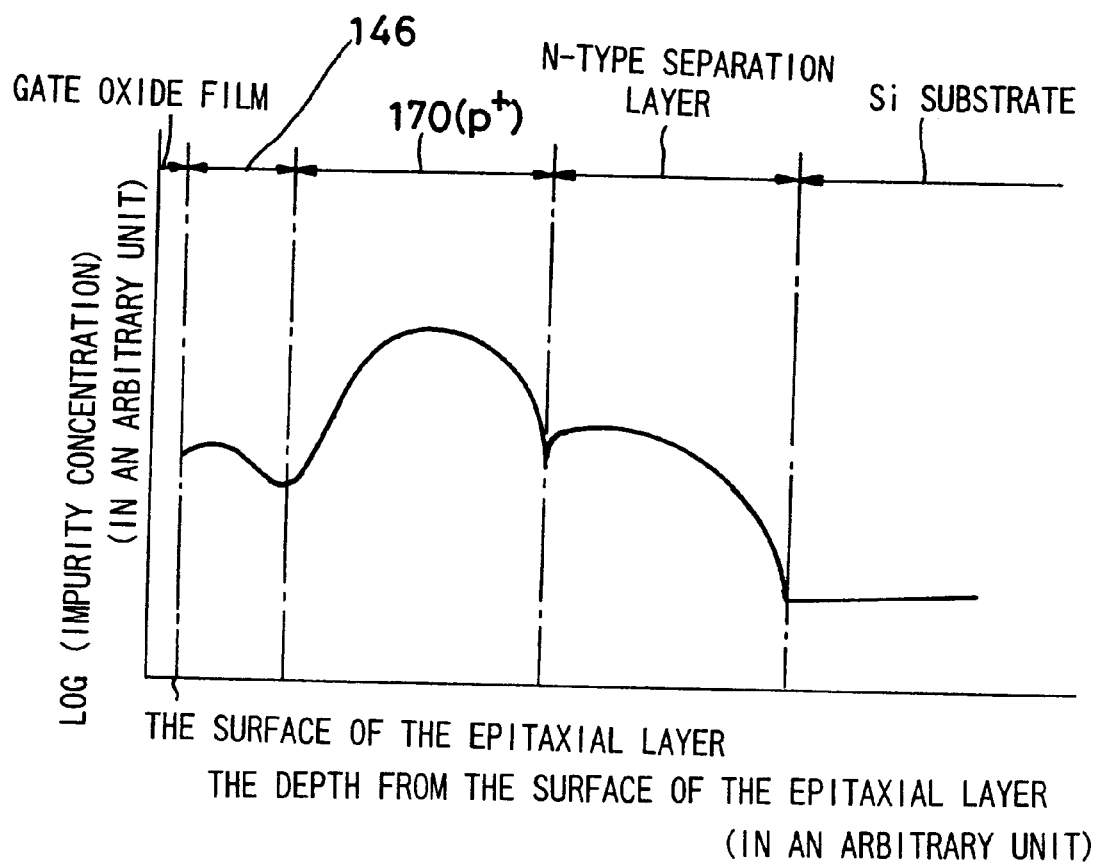
FIG. 7 is a graph showing distribution of impurity concentration in a conventional MOS transistor.

Next explained is a semiconductor device according to the second embodiment of the invention. As shown in FIG. 5, the second embodiment includes a third buried diffusion layer 90 which is connected to the n$^+$-type collector lead-out diffusion layer 16 and the second buried diffusion layer 12 within the n-type epitaxial layer 2 and also connected to the Si substrate 1 and the n-type epitaxial layer 2. The impurity concentration of the third buried diffusion layer 90 is higher than the impurity concentration of the second buried diffusion layer 12. The conduction type, depth and impurity concentration of the third buried diffusion layer 90 are the same as those of the first buried diffusion layer 7. In the other respects, the semiconductor device shown here is the same as the semiconductor device according to the first embodiment.

The semiconductor device according to the second embodiment can be manufactured as follows.

As shown in FIG. 26A, a oxide film 92 is formed on the p-type Si substrate 1 by thermal oxidation, for example. The oxide film 92 may be as thick as 10 to 30 nm, for example. Next formed on the oxide film 92 is a resist pattern 93 of a predetermined configuration by lithography. The resist pattern 93 has formed apertures 94, 95 above the regions 4 and 40.

Using the resist pattern 93 as a mask, an n-type impurity such as P$^+$, for example, is ion-implanted into the si substrate 1. For the ion implantation made here, the ion implanting energy is set to 300 keV through 1 MeV, and the dose amount to $1\times10^{13}$ through $1\times10^{15}$ per cm$^2$. the resist pattern 93 is removed thereafter.

Next as shown in FIG. 26B, an oxide film 96 is formed on the Si substrate 1 by CVD, for example. The thickness of the oxide film 96 is 300 nm, for example. Next formed on the oxide film 96 is a resist pattern (not shown) of a predetermined configuration. Using it as a mask, the oxide film 96 is selectively removed by RIE, for example, to make apertures 97, 98, 99. The resist pattern is removed thereafter. Next using the oxide film 96 as a mask, Sb is diffused into the Si substrate 1 by vapor phase diffusion using $Sb_2O_3$ to form the n$^+$-type first buried diffusion layer 7 and the n$^+$-type third buried diffusion layer 90. For the vapor phase diffusion made here, the diffusion temperature is set to 1200° C., the sheet resistance ps to 20 through 50 $\Omega/\circ$, and the diffusion depth xj to 1 through 2 $\mu$m. As a result of the vapor phase diffusion, a natural oxide film (not shown) is formed on the exposed surface of the Si substrate 1. The oxide film 96 is removed thereafter.

Next as shown in FIG. 26C, the n-type epitaxial layer 2 is grown on the Si substrate 1 by epitaxial growth. The specific resistance of the n-type epitaxial layer 2 is 0.3 to 5 $\Omega$·cm, and the thickness is 0.7 to 2 $\mu$m. By growth of the n-type epitaxial layer 2, the first buried diffusion layer 7 bites into the bottom of the n-type epitaxial layer 2, and the second buried diffusion layer 12 and the separating diffusion layer 41 align with the interface between the n-type epitaxial layer 2 and the Si substrate 1. The third buried diffusion layer 90 exhibits similar to the first buried diffusion layer 7. In the other respects, the second embodiment is the same as the first embodiment.

As explained above, the semiconductor device according to the embodiment is effective not only in the same respect as the first embodiment, but also in suppressing parasitic transistor behaviors of the second bipolar transistor and suppressing an increase of the collector resistance. Additionally, by making the third buried diffusion layer 90 simultaneously with the first buried diffusion layer 7, a higher voltage-resistant vertical bipolar transistor can be incorporated in the semiconductor device without no additional step in the manufacturing process.

For example, numerical values suggested in explanation with embodiments are only examples, and may be changed appropriately.

Although annealing is used in the first embodiment upon diffusing the impurity from the polycrystalline Si substrate 84 into the base layers 8, 13 to make and activate the emitter layers 10, 15, RTA (rapid thermal annealing) may be used instead of annealing. As appropriate conditions for RAT, the heating temperature ranges from 900 to 1100° C., and the heating time ranges from seconds to decades of seconds.

Although the first embodiment uses etch-backing to remove the bird's head 5a and to smooth the surface, CMP (chemical mechanical polishing) may be used in lieu of etch-backing, using the $Si_3N_4$ film 68 as an etching stop layer. In this case, the $Si_3N_4$ film 68 is removed after treatment by CMP.

Although ion implantation is conducted in twice in the first embodiment to make the p-type well region 42 in the n-channel MOS transistor, ion implantation may be once again done into the interface between the gate oxide film 45 and the p-type well region 42 in order to obtain a desired threshold voltage $V_{TH}$ in the n-channel MOS transistor.

As explained above, according to the first aspect of the invention, since the second buried layer and the third buried layer are substantially equal in impurity concentration, a high-speed vertical bipolar transistor, a high voltage-resistant vertical bipolar transistor and a MIS transistor can be incorporated into a single semiconductor device, and can reduce the analog/digital interference noise in the MIS transistor.

According to the second aspect of the invention, since the impurity concentration of the first buried layer is higher than the impurity concentration of the second buried layer, a higher-speed vertical bipolar transistor, a high voltage-resistant vertical bipolar transistor and a MIS transistor can be incorporated into a single semiconductor device.

What is claimed is:

1. A semiconductor device comprising:
   a substrate;
   a first buried layer of a first conduction type formed in said substrate;
   a second buried layer of the first conduction type formed in said substrate;
   a third buried layer of the first conduction type formed in said substrate;
   an epitaxial layer of the first conduction type formed on said substrate;
   a well region of a second conduction type formed in said epitaxial layer above said third buried layer;
   source/drain regions of the first conduction type formed in said well region;
   a first base region of the second conduction type formed in said epitaxial layer above said first buried layer;
   a first impurity region of the first conduction type formed on said first base region;
   a second base region of the second conduction type formed in said epitaxial layer above said second buried layer;
   a second impurity region of the first conduction type formed on said second base region;
   a first lead-out layer of the first conduction type connected to said first buried layer; and
   a second lead-out layer of the first conduction type connected to said second buried layer,
   said second buried layer having an impurity concentration substantially equal to that of said third buried layer.

2. The semiconductor device according to claim 1 wherein the depth of said first buried layer is smaller than that of said second buried layer.

3. The semiconductor device according to claim 1 wherein said well region includes a first separating diffusion layer and a second separating diffusion layer, said first separating diffusion layer having an impurity concentration higher than that of said second separating diffusion layer, and being located deeper than said second separating diffusion layer.

4. The semiconductor device according to claim 1 wherein said second buried layer is formed simultaneously with said third buried layer.

5. The semiconductor device according to claim 1 wherein said first buried layer has an impurity concentration higher than that of said second buried layer.

6. The semiconductor device according to claim 1 wherein the depth of said second buried layer is substantially equal to the depth of said third buried layer.

7. The semiconductor device according to claim 1, further comprising a fourth buried layer of the first conduction type formed in said second buried layer, said fourth buried layer connecting said second buried layer and said second lead-out layer.

8. The semiconductor device according to claim 7 wherein said fourth buried layer has an impurity concentration substantially equal to that of said first buried layer.

9. The semiconductor device according to claim 7 wherein the depth of said fourth buried layer is substantially equal to the depth of said first buried layer.

10. A semiconductor device comprising:
    a substrate;
    a first buried layer of a first conduction type formed in said substrate;
    a second buried layer of the first conduction type formed in said substrate;
    a third buried layer of the first conduction type formed in said substrate;
    an epitaxial layer of the first conduction type formed on said substrate;
    a well region of a second conduction type formed in said epitaxial layer above said third buried layer;
    source/drain regions of the first conduction type formed in said well region;
    a first base region of the second conduction type formed in said epitaxial layer above said first buried layer;
    a first impurity region of the first conduction type formed on said first base region;
    a second base region of the second conduction type formed in said epitaxial layer above said second buried layer;
    a second impurity region of the first conduction type formed on said second base region;
    a first lead-out layer of the first conduction type connected to said first buried layer; and
    a second lead-out layer of the first conduction type connected to said second buried layer,
    said first buried layer having an impurity concentration higher than that of said second buried layer.

11. The semiconductor device according to claim 10 wherein the depth of said first buried layer is smaller than that of said second buried layer.

12. The semiconductor device according to claim 10 wherein said well region includes a first separating diffusion layer and a second separating diffusion layer, said first separating diffusion layer having an impurity concentration higher than that of said second separating diffusion layer, and being located deeper than said second separating diffusion layer.

13. The semiconductor device according to claim 10 wherein the depth of said first buried layer is smaller than that of said second buried layer.

14. The semiconductor device according to claim 10, further comprising a fourth buried layer of the first conduction type formed in said second buried layer, said fourth buried layer connecting said second buried layer and said second lead-out layer.

15. The semiconductor device according to claim 14 wherein said fourth buried layer has an impurity concentration substantially equal to that of said first buried layer.

16. The semiconductor device according to claim 14 wherein the depth of said fourth buried layer is substantially equal to the depth of said first buried layer.

* * * * *